(12) United States Patent
Ahn et al.

(10) Patent No.: US 11,133,209 B2
(45) Date of Patent: *Sep. 28, 2021

(54) TRANSFER HEAD FOR MICRO LED

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 112 days.

This patent is subject to a terminal disclaimer.

(21) Appl. No.: 16/216,376

(22) Filed: Dec. 11, 2018

(65) Prior Publication Data

US 2019/0189487 A1 Jun. 20, 2019

(30) Foreign Application Priority Data

Dec. 20, 2017 (KR) ........................ 10-2017-0175991

(51) Int. Cl.
| | |
|---|---|
| *H01L 21/677* | (2006.01) |
| *H01L 25/075* | (2006.01) |
| *H01L 33/06* | (2010.01) |
| *H01L 33/44* | (2010.01) |
| *H01L 33/40* | (2010.01) |
| *H01L 33/42* | (2010.01) |
| *H01L 21/683* | (2006.01) |
| *H01L 27/15* | (2006.01) |
| *H01L 33/00* | (2010.01) |
| *H01L 21/67* | (2006.01) |

(52) U.S. Cl.
CPC .... *H01L 21/67712* (2013.01); *H01L 21/6838* (2013.01); *H01L 25/0753* (2013.01); *H01L 27/153* (2013.01); *H01L 33/0093* (2020.05); *H01L 33/06* (2013.01); *H01L 33/405* (2013.01); *H01L 33/42* (2013.01); *H01L 33/44* (2013.01); *H01L 21/67144* (2013.01); *H01L 2933/0016* (2013.01)

(58) Field of Classification Search
CPC ..................... H01L 21/67712; H01L 33/0093
See application file for complete search history.

(56) References Cited

U.S. PATENT DOCUMENTS

| | | | | | |
|---|---|---|---|---|---|
| 5,368,645 | A | * | 11/1994 | Bok ........................ | B05C 13/02 |
| | | | | | 118/500 |
| 2018/0158706 | A1* | | 6/2018 | Hsu ..................... | H01L 33/0095 |

FOREIGN PATENT DOCUMENTS

| | | |
|---|---|---|
| KR | 100731673 B1 | 6/2007 |
| KR | 1020140112486 A | 9/2014 |
| KR | 1020170019415 A | 2/2017 |
| KR | 1020170024906 A | 3/2017 |
| KR | 1020170026959 A | 3/2017 |
| KR | 101754528 B1 | 7/2017 |
| KR | 101757404 B1 | 7/2017 |

* cited by examiner

*Primary Examiner* — Lex H Malsawma
*Assistant Examiner* — Xia L Cross

(57) ABSTRACT

Disclosed is a transfer head for transferring micro-LEDs from a first substrate to a second substrate, particularly, using a vacuum adsorption method. The transfer head includes a porous member having a plurality of pores, in which the micro-LEDs are transferred by creating or releasing a vacuum pressure in the pore of the porous member.

8 Claims, 30 Drawing Sheets

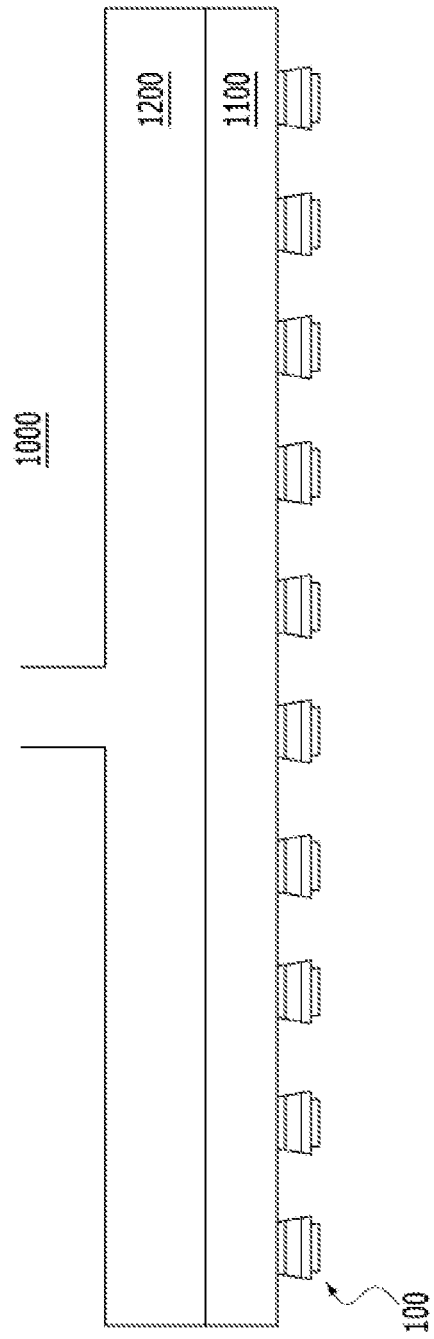

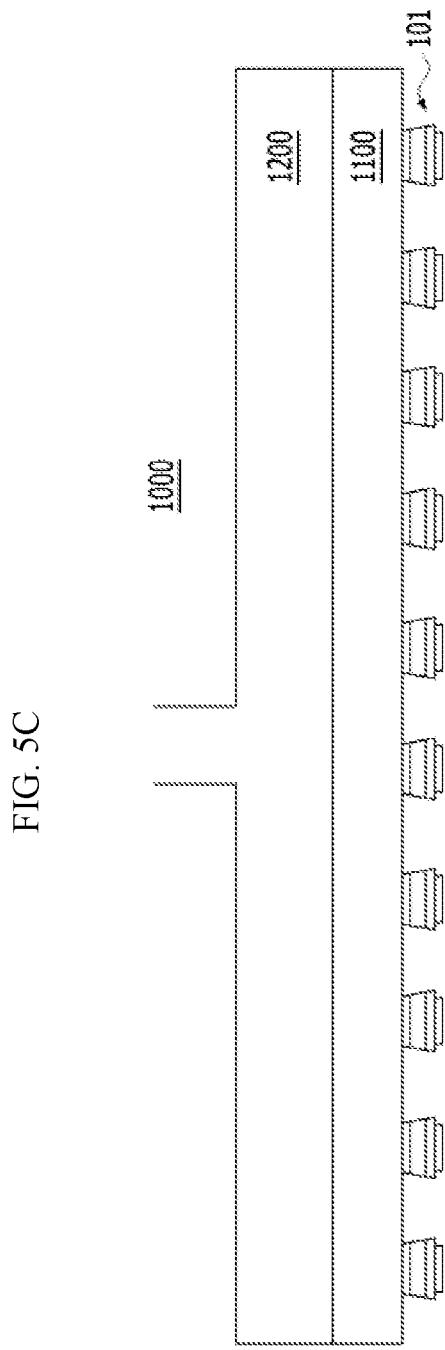

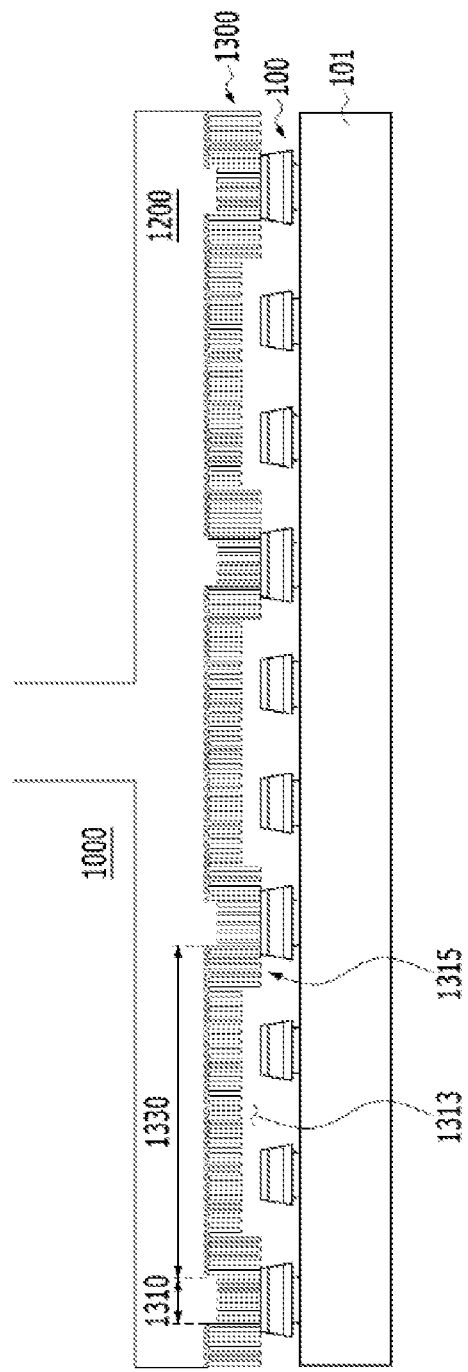

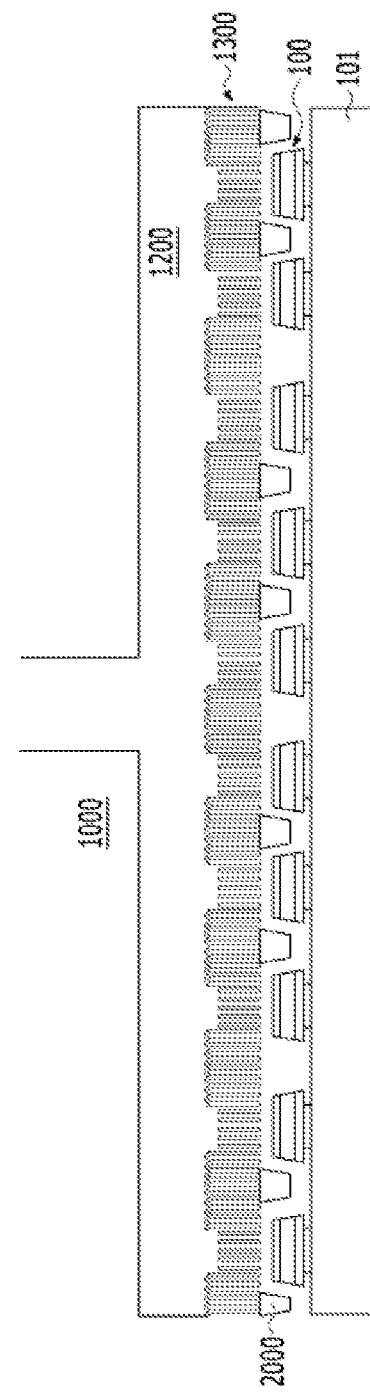

TRANSFER HEAD FOR MICRO LED

CROSS REFERENCE TO RELATED APPLICATION

The present application claims priority to Korean Patent Application No. 10-2017-0175991, filed Dec. 20, 2017, the entire contents of which is incorporated herein for all purposes by this reference.

BACKGROUND OF THE DISCLOSURE

1. Field of the Disclosure

The present invention relates to a transfer head for transferring micro-LEDs from a first substrate to a second substrate.

2. Description of the Background Art

The current display market is still dominated by LCDs, but OLEDs are rapidly replacing LCDs and becoming a mainstream in the display market. Recently, however, a micro-LED display is emerging as another next-generation display while display companies are rushing to participate in the OLED market. LCDs and OLEDs are made of liquid crystal and organic materials, respectively. On the other hand, a micro-LED display is a display using a 1 to 100 micrometer (μm) LED chip itself as a light emitting material.

The term "MicroLED" was first used by Cree Lighting Co. (currently Cree Inc.) when the company applied for a patent on "Enhanced Light Extraction through the Use of Micro-LED Arrays" in 1999 (later granted as a patent with Korean Patent Number 0731673). Since then, related research papers have been published one after another and related technology has been continuously developed. In order to apply micro-LEDs to a display device, it is necessary to develop customized microchips based on a flexible material, technology for transferring micrometer-sized LED chips, and techniques for precisely mounting the micrometer-sized LED chips on pixel electrodes of the display device.

Particularly, regarding technology for transferring micro-LED devices to a display substrate, since the size of LEDs is reduced to the order of 1 to 100 micrometers, conventional pick & place equipment cannot be used. Therefore, a transfer head technology for transferring micro-LEDs with higher precision has been required. With regard to such a transfer head technology, several structures described below have been proposed, but each of the proposed techniques has some disadvantages.

Luxvue Technology Corporation (based in USA) has proposed a method of transferring micro-LED devices using an electrostatic head (Korean Patent Application Publication No. 2014-0112486, hereinafter referred to as "Patent Document 1"). The technology of Patent Document 1 is based on the principle in which when a voltage is applied to a head portion made of a silicon material, an attraction force for attracting micro-LEDs is generated by a charging phenomenon. However, this method has a problem in that the charging phenomenon due to the voltage applied to the head portion causes damage to micro-LEDs during the electrostatic induction.

X-Celeprint Inc., based in USA, has proposed a method of transferring micro-LED devices on a wafer to a desired substrate by using a transfer head made of an elastic polymer material (Korean Patent Application Publication No. 2017-0019415, hereinafter referred to as "Patent Document 2"). This method is free of an LED damage problem as compared with the method of using the electrostatic head. However, this method has a problem that the adhesion to the elastic transfer head is required to be larger than the adhesion to the target substrate in the transfer process for stable transfer of the micro-LED devices. In addition, an additional process of forming electrodes is required. In addition, maintaining the adhesive strength of the elastic polymer material is also a very important factor.

The Korean Photonics Technology Institute has proposed a method of transferring micro-LED devices using a ciliary adhesive structure head (Korean Patent No. 1754528, hereinafter referred to as "Patent Document 3"). However, Patent Document 3 has a disadvantage in that it is difficult to produce a ciliary adhesive structure.

Korea Institute of Machinery & Materials has proposed a method of transferring micro-LED devices by applying an adhesive onto the surface of a roller (Korean Patent No. 1757404, hereinafter referred to as "Patent Document 4"). However, Patent Document 4 has a disadvantage in that it is necessary to use the adhesive continuously and the micro-LEDs are likely to be damaged when the roller is pressed against the micro-LEDs.

Samsung Display Co., Ltd. proposed a method of transferring micro-LED devices, by using electrostatic induction, to an array substrate by applying a negative voltage to first and second electrodes of the array substrate in a state in which the array substrate is immersed in a solution (Korean Patent Application Publication No. 2017-0026959, hereinafter referred to as "Patent Document 5"). However, Patent Document 5 has a problem in that since the micro-LEDs are immersed and transferred to the array substrate while being immersed in the solution, a separate solution and the subsequent drying process are required.

LG Electronics Co., Ltd. proposed a method of disposing a head holder between a plurality of pick-up heads and a substrate and deforming the head holder according to the movement of the pick-up heads to enable the pick-up heads to freely move (Korean Patent Application Publication No. 2017-0024906, hereinafter referred to as "Patent Document 6"). However, Patent Document 6 has a disadvantage in that an additional process of applying a bonding material to the pickup heads is required to transfer micro-LED devices because the method of Patent Document 6 is a method of transferring micro-LED devices by applying a bonding material having an adhesion to the surfaces of the pickup heads.

In order to solve the problems of the related arts described above while adopting the basic principles thereof, it is necessary to remove the above-mentioned disadvantages. However, since such disadvantages are derived from the inherent characteristics of the basic principles adopted by the related arts, there are limitations in eliminating the disadvantages to improve the technologies of the related arts. Therefore, the inventors of the present invention not only ameliorate the disadvantages of the related arts but also propose a new method which has not been considered in the related arts at all.

Documents of Related Art (Patent Document 1) Korean Patent No. 0731673
(Patent Document 2) Korean Patent Application Publication No. 2014-0112486
(Patent Document 3) Korean Patent Application Publication No. 2017-0019415

(Patent Document 4) Korean Patent No. 1754528
(Patent Document 5) Korean Patent No. 1757404
(Patent Document 6) Korean Patent Application Publication No. 10-2017-0026959
(Patent Document 7) Korean Patent Application Publication No. 10-2017-0024906

SUMMARY OF THE DISCLOSURE

Accordingly, an objective of the present invention is to provide a micro-LED transfer head which solves the problem of a conventional micro-LED transfer head having a vacuum suction structure capable of transferring micro-LEDs.

In order to accomplish the objective of the invention, there is provided a micro-LED transfer head including a porous member having pores in which a vacuum pressure is created and released to transfer a micro-LED.

The porous member may be divided into an adsorption region within which adsorption of the micro-LED occurs and a non-adsorption region within which adsorption of the micro-LED does not occur.

A horizontal area of the absorption region may be smaller than a horizontal area of an upper surface of the micro-LED.

The porous member may be an anodic oxide film formed by anodizing a metal.

The porous member may include: the adsorption region within which the pore is a vertical hole continuously elongated in a vertical direction from an upper surface to a lower surface of the porous member; and the non-adsorption region within which the vertical hole is closed at an upper end or a lower end thereof.

The non-adsorption region may be formed by closing the upper end or the lower end of the vertical hole with a barrier layer which is formed during formation of the anodic oxide film, and the adsorption region may be formed by removing the barrier layer so that the upper end or the lower end of the vertical hole are open.

The non-adsorption region may be provided with a metal layer and the adsorption region may not be provided with the metal layer.

The porous member may have a protruding dam at the lower surface of the porous member.

The micro-LED transfer head may further include a vacuum chamber provided on the upper surface of the porous member.

The micro-LED transfer head may further include a porous support provided on the upper surface of the porous member to reinforce the porous member.

The micro-LED transfer head may further include a porous buffering member provided on the upper surface of the porous member to buffer a contact impact of the porous member.

The porous member may further include a first porous member and a second porous member. The first porous member functions to vacuum-adsorb the micro-LED and the second porous member is disposed between the vacuum chamber and the first porous member to transfer a vacuum pressure of the vacuum chamber to the first porous member.

As described above, the micro-LED transfer head according to the present invention can transfer the micro-LED from a first substrate to a second substrate by using vacuum adsorption.

BRIEF DESCRIPTION OF THE DRAWINGS

FIG. 3 is a diagram illustrating a micro-LED transfer head according to a first embodiment of the present invention;

FIGS. 5A through 5D are diagrams illustrating a method of transferring a micro-LED using the micro-LED transfer head according to the first embodiment of the present invention;

FIGS. 11 and 12 are diagrams illustrating a modification to the second embodiment of the present invention;

FIGS. 19A to 19B are diagrams illustrating a modification to the fifth embodiment of the present invention.

DETAILED DESCRIPTION OF THE DISCLOSURE

Figure 1:
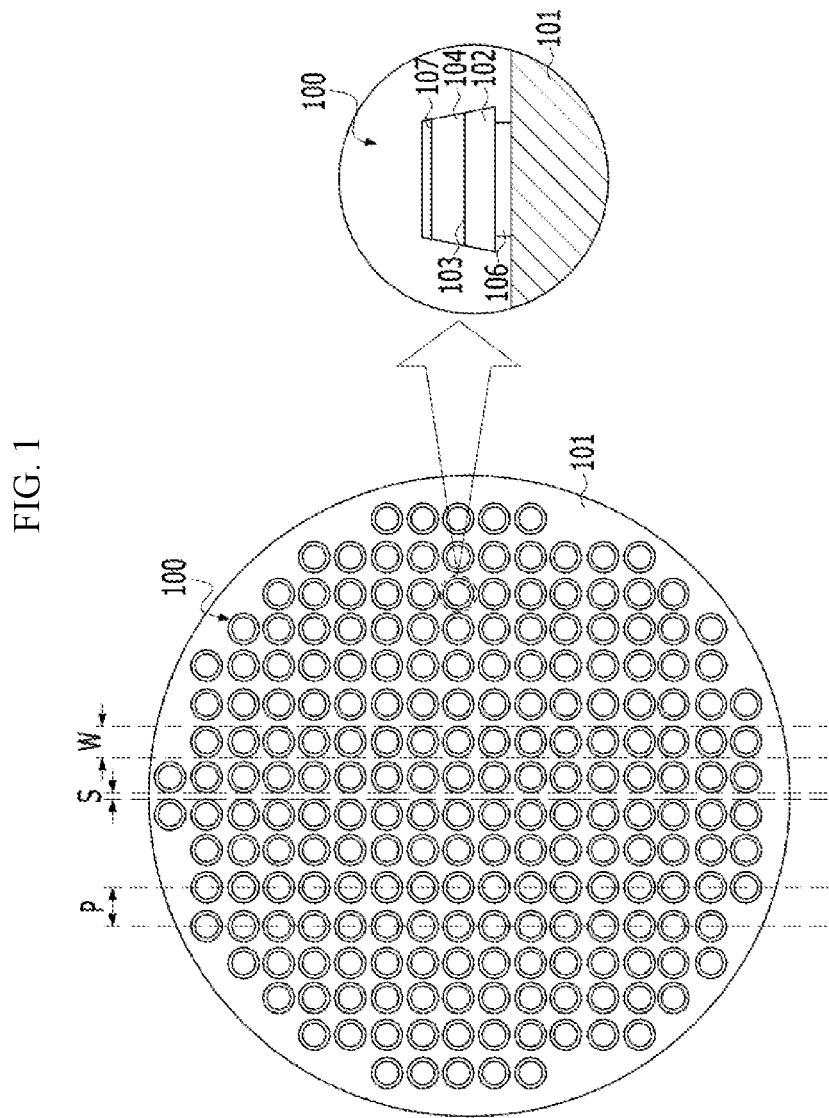
FIG. 1 is a diagram illustrating a micro-LED that is a target to be transferred by a micro-LED transfer head according to one embodiment of the present invention.

Hereinafter, the following merely illustrates the principles of the invention. Therefore, those skilled in the art will be able to devise various devices which, although not explicitly described or illustrated herein, embody the principles of the invention and fall within the concept and scope of the invention. It is also to be understood that all conditional terms and embodiments described in this specification are, in principle, intended only for the purpose of enabling the inventive concept to be understood, and are not intended to limit the scope of the invention to such specifically recited embodiments and conditions.

The foregoing and other objects, features, and advantages of the present invention will become more apparent from the following detailed description of the present invention when taken in conjunction with the accompanying drawings. Accordingly, those skilled in the art will readily understand the technical idea of the present invention from the detailed description.

The embodiments described herein will be described with reference to cross-sectional views and/or perspective views that are ideal illustrations of the present invention. The thicknesses of the films and regions and the diameters of the holes shown in the drawings are exaggerated for an effective description of the technical idea. The shape of the illustrations may be modified according to manufacturing techniques and/or tolerances. Also, the number of micro-LEDs shown in the drawings is only a part of the entirety. Accordingly, embodiments of the present invention are not limited to specific forms that are illustrated, but they change in the shapes according to manufacturing process.

In describing various embodiments, the same functional elements are denoted by the same reference numerals throughout the embodiments. In addition, the configuration and operation already described in other preceding embodiments will be omitted for the sake of convenience.

Hereinafter, preferred embodiments of the present invention will be described in detail with reference to the accompanying drawings.

FIG. 1 is a view illustrating a plurality of micro-LEDs 100 that are transfer targets to be transported by a micro-LED transfer head according to a preferred embodiment of the present invention. The micro-LEDs 100 are fabricated on a growing substrate 101.

The growing substrate 101 is a conductive substrate or an insulating substrate. For example, the growing substrate 101 is formed of at least one of sapphire, SiC, Si, GaAs, GaN, ZnO, Si, GaP, InP, Ge, and $Ga_2O_3$.

Each of the micro-LEDs 100 includes a first semiconductor layer 102, a second semiconductor layer 104, an active layer 103 formed between the first semiconductor layer 102 and the second semiconductor layer 104, a first contact electrode 106, and a second contact electrode 107.

The first semiconductor layer 102, the active layer 103, and the second semiconductor layer 104 are formed by metal organic chemical vapor deposition (MOCVD), chemical vapor deposition (CVD), plasma chemical vapor deposition (PECVD), molecular beam epitaxy (MBE), hydride vapor phase epitaxy (HYPE), or the like.

The first semiconductor layer 102 is implemented, for example, by a p-type semiconductor layer. The p-type semiconductor layer formed by preparing a semiconductor layer made of a semiconductor material having a composition formula of $In_xAl_yGa_{1-x-y}N$ ($0 \le x \le 1$, $0 \le y \le 1$, $0 \le x+y \le 1$), for example, GaN, AlN, AlGaN, InGaN, InN InAlGaN, AlInN, or the like, and then by doping the semiconductor layer with a p-type dopant such as Mg, Zn, Ca, Sr, or Ba.

The second semiconductor layer 104 is, for example, an n-type semiconductor layer. The n-type semiconductor layer is formed by preparing a semiconductor layer made of a semiconductor material having a composition formula of $In_xAl_yGa_{1-x-y}N$ ($0 \le x \le 1$, $0 \le y \le 1$, $0 \le x+y \le 1$), for example, GaN, AlN, AlGaN, InGaN, InNInAlGaN, AlInN, or the like, and then by doping the semiconductor layer with an n-type dopant such as Si, Ge, or Sn.

However, the present invention is not limited thereof. That is, the first semiconductor layer 102 may be an n-type semiconductor layer, and the second semiconductor layer 104 may be a p-type semiconductor layer.

The active layer 103 is a region where electrons and holes are recombined. As the electrons and the holes are recombined, the active layer 103 transitions to a lower energy level and a light ray having a wavelength corresponding the change in the energy level is generated. The active layer 103 is formed of, for example, a semiconductor material having a composition formula of $In_xAl_yGa_{1-x-y}N$ ($0 \le x \le 1$, $0 \le y \le 1$, $0 \le x+y \le 1$). The active layer 103 has a quantum well structure or a multi-quantum well (MQW) structure. Alternatively, it may have a quantum wire structure or a quantum dot structure.

The first contact electrode 106 is formed on the first semiconductor layer 102 and the second contact electrode 107 is formed on the second semiconductor layer 104. The first contact electrode 106 and/or the second contact electrode 107 includes one or more layers and may be formed of a conductive material selected among various conductive materials including metals, conductive oxides, and conductive polymers.

The growing substrate 101 on which the plurality of micro-LEDs 100 are formed is cut along dicing lanes by laser scanning or etching. The plurality of micro LEDs 100 enters a state in which they are individually separated from the growing substrate 101 by undergoing a laser lift-off process.

In FIG. 1, 'p' denotes a pitch of the micro-LEDs 100, 's' denotes a distance (spacing) between the micro-LEDs 100, and 'w' denotes a width of each of the micro-LEDs 100.

Figure 2:
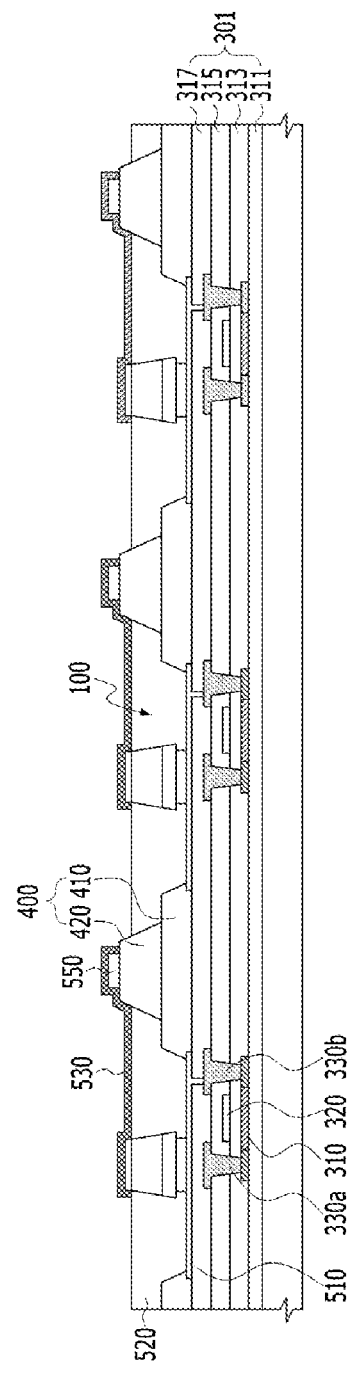
FIG. 2 is a diagram illustrating a micro-LED structure transferred onto a display substrate and packaged according to one embodiment of the present invention.

FIG. 2 is a view illustrating a micro-LED structure that is formed after being transferred to a display substrate by a micro-LED transfer head according to a preferred embodiment of the present invention and then packaged.

The display substrate 301 can be made of various materials. For example, the display substrate 301 is made of a transparent glass material containing $SiO_2$ as a main component. However, the material of the display substrate 301 is not necessarily limited thereto. That is, the display substrate 301 may be made of a transparent plastic material so as to be soluble. The plastic material may be an organic material selected from the group consisting of polyethersulphone (PES), polyacrylate (PAR), polyetherimide (PEI), polyethyelenenaphthalate (PEN), polyethylene terephthalate (PET) polyethyelenetherepthalate, polyphenylene sulfide (PPS), polyallylate, polyimide, polycarbonate (PC), cellulose triacetate (TAC), and cellulose acetate propionate (CAP).

In the case of a bottom emission type display in which an image is displayed on the display substrate 301 side, the display substrate 301 needs to be formed of a transparent material. However, in the case of a top emission type display in which an image is displayed on the opposite side of the display substrate 301, the display substrate 301 is not necessarily formed of a transparent material. In this case, the display substrate 301 may be formed of a metal.

When the display substrate 301 is formed of a metal, the material of the display substrate 301 includes at least one selected from the group consisting of iron, chromium, manganese, nickel, titanium, molybdenum, stainless steel (SUS), Invar alloys, Inconel alloys and Kovar alloys, but is not limited thereto.

The display substrate 301 includes a buffer layer 311. The buffer layer 311 provides a flat surface and blocks foreign matter or moisture. For example, the buffer layer 311 is made of an inorganic material such as silicon oxide, silicon nitride, silicon oxynitride, aluminum oxide, aluminum nitride, titanium oxide or titanium nitride; an organic material such as polyimide, polyester, or acryl; or a multilayer of those materials.

A thin film transistor (TFT) includes an active layer 310, a gate electrode 320, a source electrode 330a, and a drain electrode 330b.

Hereinafter, a case where the TFT is of a top gate type in which the active layer 310, the gate electrode 320, the source electrode 330a, and the drain electrode 330b are sequentially formed in this order will be described. However, the present invention is not limited thereto, and any other type of TFT, such as a bottom gate type, may be employed.

The active layer 310 is made of a semiconductor material, such as amorphous silicon or poly crystalline silicon. However, the present invention is not limited thereto, and the active layer 310 may be made of various materials. In an alternative embodiment, the active layer 310 is made of an organic semiconductor material or the like.

In a further alternative embodiment, the active layer 310 is made of an oxide semiconductor material. Specifically, the active layer 310 is formed of a metal element selected from Group 12, 13, and 14 metal elements including zinc (Zn), indium (In), gallium (Ga), tin (Sn), cadmium (Cd), germanium, or of a metal oxide of any selected metal element among those metal elements.

A gate insulating layer 313 is formed on the active layer 310. The gate insulating layer 313 serves to insulate the active layer 310 from the gate electrode 320. The gate insulating layer 313 is formed of a multilayer or a single layer made of an inorganic material, such as a silicon oxide and/or a silicon nitride.

The gate electrode 320 is formed on the gate insulating film 313. The gate electrode 320 is connected to a gate line (not illustrated) for applying an on/off signal to the TFTs.

Preferably, the gate electrode 320 is made of a low-resistance metal material. Specifically, the gate electrode 320 is a single layer or a multilayer formed of one or more metals selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

On the gate electrode 320, an interlayer insulating film 31 is formed. The interlayer insulating film 315 isolates the source electrode 330a and the drain electrode 330b from the gate electrode 320. The interlayer insulating film 315 is a multilayer or a single layer made of an inorganic material. For example, the inorganic material is a metal oxide or a metal nitride. Specifically, the inorganic materials include silicon oxide ($SiO_2$), silicon nitride ($SiN_x$), silicon oxynitride (SiON), aluminum oxide ($Al_2O_3$), titanium oxide ($Ta_2O_5$) hafnium oxide ($HfO_2$), and zinc oxide ($ZrO_2$).

The source electrode 330a and the drain electrode 330b are formed on the interlayer insulating film 315. Each of the source electrode 330a and the drain electrode 330b is a single layer or a multilayer made of one or more metals selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to the source region and the drain region in the active layer 310, respectively.

On the TFTs, a planarization layer 317 is formed. The planarization layer 317 covers the thin film transistors (TFT) to eliminate a surface unevenness attributable to the thin film transistors (TFT), thereby providing a planarized top surface. The planarization layer 317 is a single layer or a multi-layer made of an organic material. The organic materials include: general purpose polymers such as polymethylmethacrylate (PMMA) and Polystyrene (PS); polymer derivatives having a phenol group; acrylic polymers; imide-based polymers; arylether-based polymers; amide-based polymers; fluorine-based polymers; p-xylene-based polymers; vinyl alcohol-based polymers; and blends of the polymers. In addition, the planarization layer 317 may be formed of a composite stacked structure including an inorganic insulating film and an organic insulating film.

The first electrodes 510 are provided on the planarization layer 317. Each of the first electrodes 510 is electrically connected to a corresponding one of the thin film transistors TFTs. Specifically, the first electrodes 510 are electrically connected to the respective drain electrode 330b via respective contact holes formed in the planarization layer 317. The first electrodes 510 can be formed in various shapes. For example, the first electrodes 510 are patterned in an island form. A bank layer 400 defining a pixel region is provided on the planarization layer 317. The bank layer 400 has cavities in which micro-LEDs 100 will be received. The bank layer 400 includes, for example, a first bank layer 410 defining the cavities. The height of the first bank layer 410 is determined by the height and the viewing angle of the micro-LEDs 100. The size (width) of the cavity is determined depending on the resolution, the pixel density, and the like of a display device. In one embodiment, the height of micro-LEDs 100 is greater than the height of the first bank layer 410. The cavity has a rectangular cross-sectional shape, but the embodiments of the present invention are not limited thereto. The cavity may have one of various cross-sectional shapes such as a polygon, a rectangle, a circle, a conical shape, an oval shape, and a triangle shape.

The bank layer 400 further includes a second bank layer 420 provided on the first bank layer 410. The first bank layer 410 and the second bank layer 420 have a step difference and the width of the second bank layer 420 is smaller than the width of the first bank layer 410. A conductive layer 550 is provided on the upper surface of the second bank layer 420. The conductive layer 550 is arranged to be parallel to data lines or scan lines, and is electrically connected to the second electrode 530. However, the present invention is not limited thereto. The second bank layer 420 may be omitted, and the conductive layer 550 may be disposed on the first bank layer 410. Alternatively, the second bank layer 420 and the conductive layer 500 may be omitted, and the second electrode 530 may be formed over the entire substrate 301 as a common electrode shared by all of the pixels P. The first bank layer 410 and the second bank layer 420 contain a light absorptive material that absorbs at least a portion of the light, or a light reflective material, or a light scattering material. The first bank layer 410 and the second bank layer 420 contain an insulating material that is translucent or opaque to visible light (e.g., light in a wavelength range of 380 nm to 750 nm).

For example, the first bank layer 410 and the second bank layer 420 are made of: a thermo plastic resin such as polycarbonate (PC), polyethylene terephthalate (PET), polyethersulfone, polyvinyl butyral, polyphenylene ether, polyamide, polyetherimide, norbornene-based resin, methacrylic resin, and cyclic polyolefin resin; a thermosetting resin such as epoxy resin, phenol resin, urethane resin, acrylic resin, vinyl ester resin, imide-based resin, urethane-based resin, urea resin, and melamine resin; or an organic insulating material such as polystyrene, polyacrylonitrile, and polycarbonate.

Alternatively, the first bank layer 410 and the second bank layer 420 are made of an inorganic insulating material such as an inorganic oxide or an inorganic nitride. The inorganic insulating materials include $SiO_x$, $SiN_x$, $SiN_xO_y$, $AlO_x$, $TiO_x$, $TaO_x$, and $ZnO_x$ but are not limited thereto. In one embodiment, the first bank layer 410 and the second bank layer 420 are made of an opaque material such as a black matrix material. Examples of the insulating black matrix material include: resins such as organic resins, glass pastes, and black pigments; particles of a metal such as nickel, aluminum, molybdenum, and alloys thereof; particles of a metal oxide such as chromium oxide; and particles of a metal nitride such as chromium nitride. According to one modification to the above-described embodiment, the first bank layer 410 and the second bank layer 420 are dispersed Bragg reflectors (DBR) having a high reflectivity or metal mirror reflectors.

The micro-LEDs 100 are disposed inside the respective cavities. Each of the micro-LEDs 100 is electrically connected to the corresponding first electrode 510 within the corresponding cavity.

The micro-LEDs 100 emit light having wavelengths of red, green, blue, and white, and can realize white light by using fluorescent materials or combining colors. The micro-LEDs 100 have a size of 1 µm to 100 µm. The micro-LEDs 100 are individually or collectively picked up from the growing substrate 101 by a transfer head according to an embodiment of the present invention and transferred to the display substrate 301 so as to be received in the respective cavities.

The micro-LED 100 includes a p-n diode, a first contact electrode 106 disposed on a first side of the p-n diode, and a second contact electrode 107 disposed on a second side (opposite to the first side) of the first contact electrode 106. The first contact electrode 106 is connected to the first electrode 510 and the second contact electrode 107 is connected to the second electrode 530.

The first electrode 510 includes a reflective layer formed of Ag, Mg, Al, Pt, Pd, Au, Ni, Nd, Ir, Cr, or a compound thereof and a transparent or translucent electrode layer formed on the reflective layer. The transparent or translucent electrode layer includes a layer formed of any one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The passivation layer 520 surrounds each of the micro-LEDs 100 provided in the respective cavities. The passivation layer 520 fills gaps between the bank layer 400 and each of the micro-LEDs 100, thereby covering the cavities and the first electrodes 510. The passivation layer 520 is formed of an organic insulating material. For example, the passivation layer 520 is formed of acryl, poly methyl methacrylate) (PMMA), benzocyclobutene (BCB), polyimide, acrylate, epoxy, or polyester, but the material of the passivation layer is not limited thereto.

The passivation layer 520 is formed to a height at which the top surface of the micro-LEDs 100, i.e., the second contact electrode 107, are not covered. That is, the second contact electrode 107 is exposed when being viewed from above the passivation layer 520. A second electrode 530 electrically connected to the exposed second contact electrode 107 of the micro-LEDs 100 is disposed on the passivation layer 520.

The second electrode 530 spans over the micro-LEDs 100 and the passivation layer 520. The second electrode 530 is formed of a transparent conductive material such as ITO, IZO, ZnO, or $In_2O_3$.

First Embodiment

FIG. 3 is a view illustrating a state in which micro-LEDs are adsorbed by vacuum attraction by a micro-LED transfer head 1000 according to a first preferred embodiment of the present invention. The micro-LED transfer head 1000 according to the first embodiment of the present invention includes a porous member 1100 having pores. The micro-LED transfer head 1000 creates or releases a vacuum state in the pores of the porous member 1100 to transfer the micro-LEDs 100 from a first substrate (for example, the growing substrate 101) to a second substrate (for example, a display substrate 301).

A vacuum chamber 1200 is provided on top of the porous member 1100. The vacuum chamber 1200 is connected to a vacuum port for creating or releasing a vacuum pressure. The vacuum chamber 1200 functions to create or release a vacuum pressure in the pores of the porous member 1100 according to the operation of the vacuum port. A limitation is not specifically imposed on the structure for coupling the vacuum chamber 1200 to the porous member 1100. Any coupling structure is possible as long as the structure is suitable for creating and releasing a vacuum pressure in the pores of the porous member 1100 while preventing the leakage of vacuum.

At the time of vacuum-adsorbing the micro-LEDs 100, the vacuum is created first in the vacuum chamber 1200 and is then spread to the pores of the porous member 1100, so that a vacuum attraction force for attracting the micro-LEDs 100 is created and thus the micro-LEDs 100 are vacuum-adsorbed. At the time of detaching the micro-LEDs 100 from the micro-LED transfer head, the vacuum applied to the vacuum chamber 1200 is released. Therefore, the vacuum is also released from the pores of the porous member 1100. As a result, the vacuum attraction force for attracting the micro-LEDs 100 is removed.

The porous member 1100 includes a layer formed of a material having a large number of pores therein. The porous member 1100 is formed in a powder form, a thin/thick film form, or a bulk body form having a porosity of about 0.2 to 0.95 in which the pores are regularly arranged or dispersed in a disordered manner. The pores of the porous member 1100 include micro pores having a pore size of 2 nm or smaller, meso pores having a pore size of 2 to 50 nm, and/or macro pores having a size of 50 nm or larger. The porous member 1100 is an organic, inorganic (ceramic), metal, or hybrid-type porous member. The porous member 1100 includes an anodic oxide film in which pores are regularly arranged. The porous member 1100 may be a powder form, a coating film form, or a bulk body form in terms of the shape. In the case of a powder form, various shapes of powder, such as a spherical shape, a hollow sphere shape, a fiber shape, and a tube shape, can be used. In some cases, the powder is used as it is, or the powder may be formed into a coating film or a bulk body.

In the case where the pores of the porous member 1100 are dispersed in a disordered manner, the pores in the porous member 1100 are likely to be connected to each other, thereby forming flow paths extending from an upper surface to a lower surface of the porous member 1100. On the other hand, when the pores of the porous member 1100 have a vertical hole structure, the upper side and the lower side of the porous member 1100 communicate with each other through the pores serving as air flow paths.

The porous member 1100 is divided into adsorption regions 1110 to which the micro-LEDs 100 are respectively adsorbed and non-adsorption regions 1130 to which the micro-LEDs 100 are not adsorbed. The adsorption regions 1110 is regions to which the vacuum of the vacuum chamber 1200 is propagated to adsorb the micro-LEDs 100 and the non-adsorption regions 1130 are regions to which the vacuum of the vacuum chamber 1200 is not propagated so as not to adsorb the micro-LEDs 100.

The non-adsorption regions 1130 are implemented by locally forming a shielding member on the surface of the porous member 1100. The shielding member is formed to cover the pores formed in the porous member 1100. The shielding member is provided on a portion of either or both of the upper surface and the lower surface of the porous member 1100. In the case where the pores of the porous member 1100 are dispersed in a disordered manner, the shielding member is formed on both of the upper surface and the lower surface of the porous member 100.

The shielding member is not limited in its material, shape and thickness as long as it can function to block the pores formed in the porous member 1100. Preferably, a photoresist (PR) (including a dry film PR) layer or a metal layer may be provided on the porous member 1100 so as to serve as the shielding member. Alternatively, the shielding function may be achieved by the intrinsic-structure of the porous member 1100. Here, the intrinsic-structure of the porous member 1100, which serves as the shielding portion, refers to, for example, a barrier layer or a metal base material in the case where the porous member 1100 is made of an anodic oxide film.

The size of the horizontal area of each adsorption region 1110 is smaller than the size of the horizontal area of the upper surface of each of the micro-LEDs 100. With such size setting, it is possible to prevent vacuum leakage when the micro-LEDs 100 are vacuum-adsorbed. Therefore, the micro-LEDs 100 can be easily vacuum-adsorbed.

The transfer head 1000 may be provided with a monitoring unit for monitoring the degree of vacuum of the vacuum chamber 1200. The monitoring unit enables monitoring of the degree of vacuum formed in the vacuum chamber 1200. Thus, a controller can control the degree of vacuum formed in the vacuum chamber 1200 while monitoring the degree of vacuum in the vacuum chamber 1200. When the monitoring unit indicates that the degree of vacuum of the vacuum chamber 1200 is lower than a predetermined degree of vacuum, the controller determines that not all of the micro-LEDs 100 are adsorbed by the porous member 100 or that there is a leakage of vacuum, and makes a command such that the transfer head 1000 operates again. In this way, the transfer head 1000 can transfer the micro-LEDs 100 without error by monitoring the degree of vacuum in the vacuum chamber 1200.

The transfer head 1000 is provided with a cushioning member for buffering a contact impact between the porous member 1100 and the micro-LEDs 100. A limitation may not be imposed on the material of the cushioning member. Any material that has an elastic restoring force and can buffer a contact impact between the porous member 1100 and the micro-LEDs 100 can be used as the material of the cushioning member. The cushioning member is provided between the porous member 1100 and the vacuum chamber 1200, but the location of the cushioning member is not limited thereto. The cushioning member may be provided at any position in the transfer head 1000 as long as a contact impact between the porous member 1100 and the micro-LEDs 100 can be reduced.

Figure 4A:
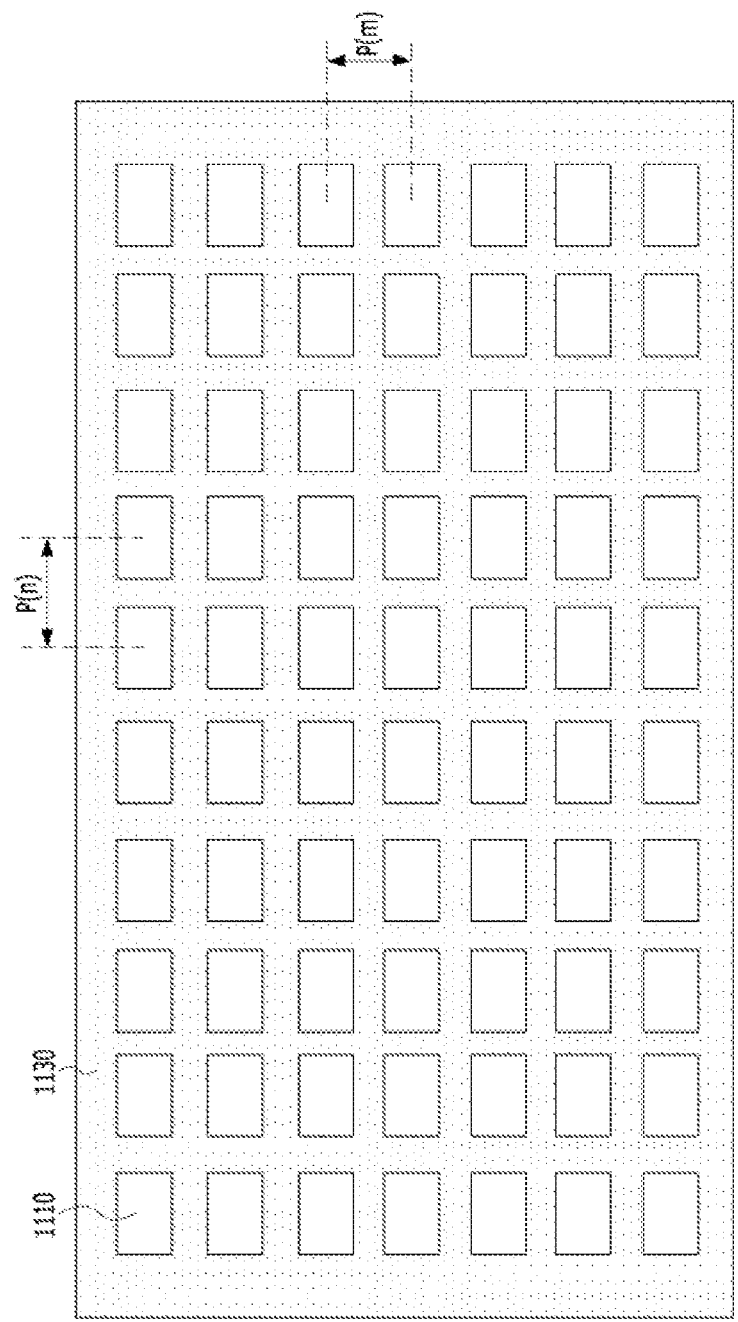
FIGS. 4A through 4D are diagrams illustrating examples of an adsorption region and a non-adsorption region according to the first embodiment of the present invention.

In the case where the pitch of the micro-LEDs 100 on the growing substrate 101 is P(n) in the column direction and the pitch in the row direction is P(m), the adsorption regions 1110 are arranged at the same pitches (P(n) and P(m)) as the micro-LEDs 100 on the growing substrate 101 as illustrated in FIG. 4A. In other words, when the pitch of the micro-LEDs 100 on the growing substrate 101 in the column direction is P(n) and the pitch in the row direction is P(m), the pitch in the column direction and the pitch in the row direction of the adsorption regions 1100 in the transfer head 1000 are respectively P(n) and P(m). With the above-described structure, the micro-LED transfer head 1000 can vacuum-adsorb all of the micro-LEDs 100 formed on the growing substrate 101 at one time.

Figure 4B:
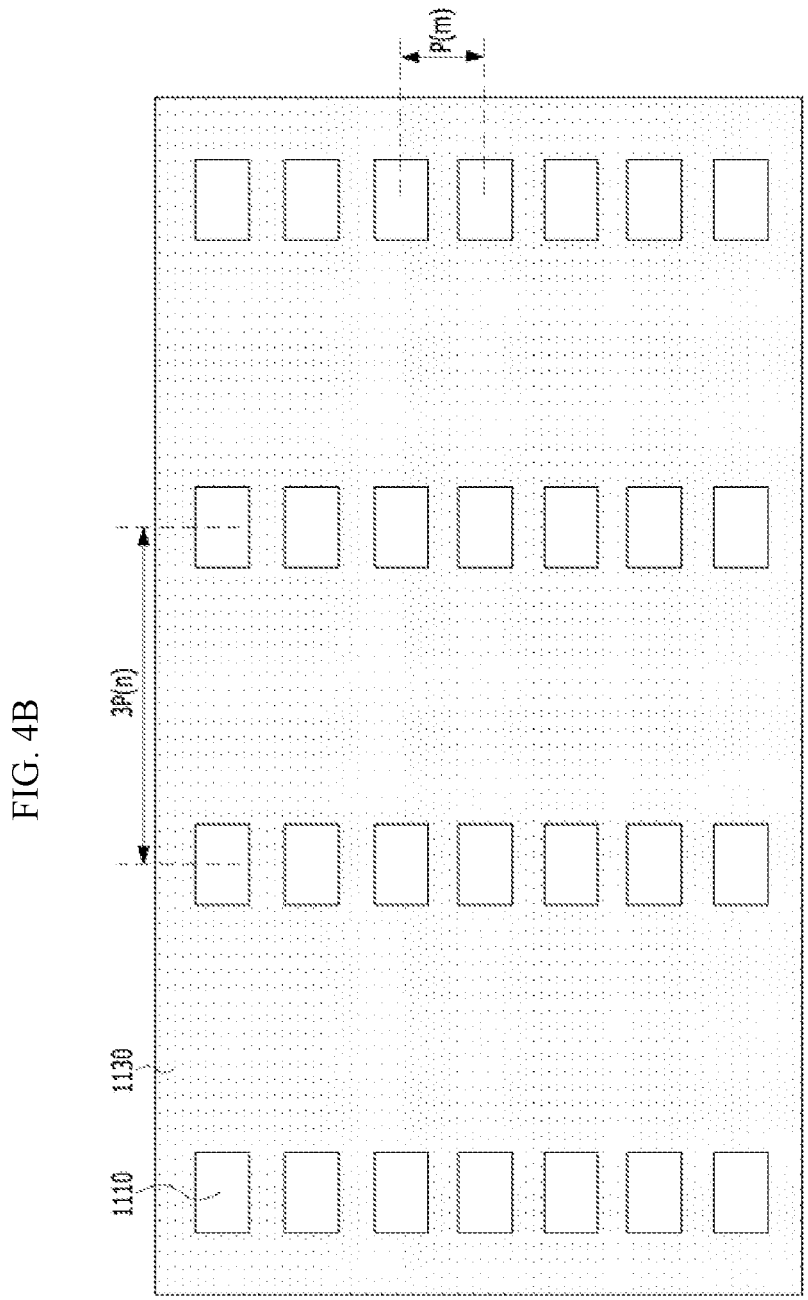

In other words, when the pitch of the micro-LEDs 100 on the growing substrate 101 in the column direction is P(n) and the pitch in the row direction is P(m), the pitch in the column direction and the pitch in the row direction of the adsorption regions 1100 may be respectively 3p(n) and p(m) as illustrated in FIG. 4B. Here, 3p(n) means 3 times the column-direction pitch p(n) illustrated in FIG. 4A. With such pitch settings, only the micro-LEDs 100 disposed at the columns corresponding to multiples of three can be vacuum-adsorbed. Here, the micro-LEDs 100 which are transferred at this time, that is, the micro-LEDs corresponding to the columns corresponding to multiples of three, may be any one of red, green, blue, and white LEDs. With this configuration, the micro-LEDs 100 of the same luminous color mounted on the display substrate 301 can be transferred at intervals of 3p(n).

Figure 4C:
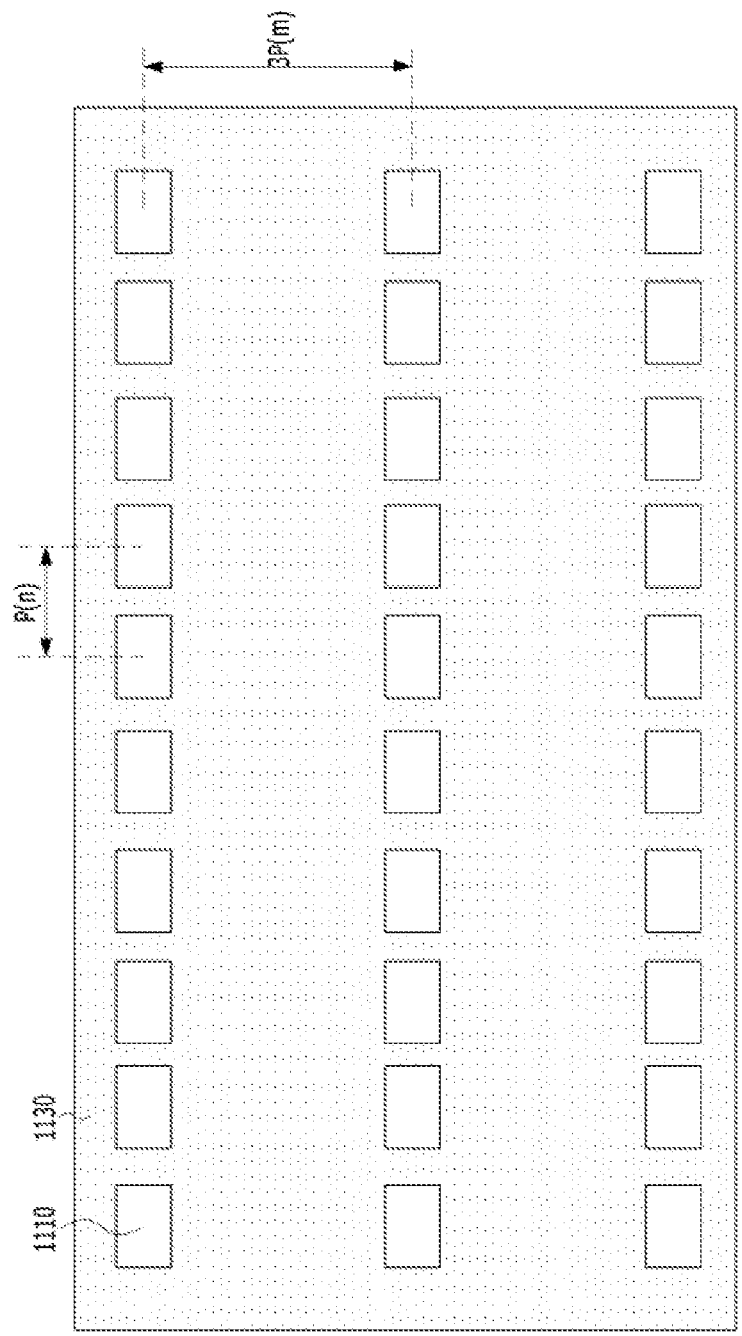
Figure 4D:
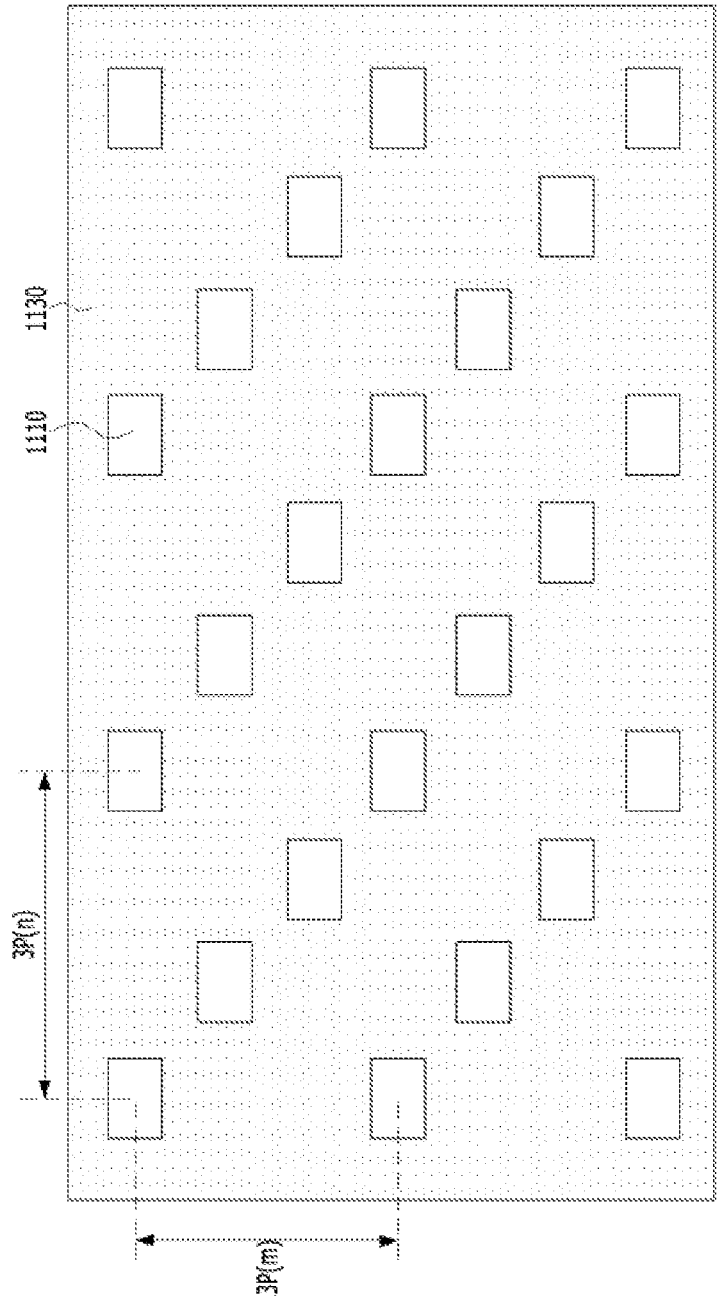

In other words, when the pitch of the micro-LEDs 100 on the growing substrate 101 in the column direction is P(n) and the pitch in the row direction is P(m), the pitch in the column direction and the pitch in the row direction of the adsorption regions 1100 may be respectively p(n) and 4p(m) as illustrated in FIG. 4C. Here, 3p(m) means 3 times the row-direction pitch p(m) illustrated in FIG. 4A. According to the above configuration, only the micro-LEDs 100 disposed at the rows corresponding to multiples of three may be vacuum-adsorbed. Here, the micro-LEDs 100 which are transferred at this time, that is, the micro-LEDs corresponding to the rows corresponding to the multiples of three, may be any one of red, green, blue, and white LEDs. With this configuration, the micro-LEDs 100 of the same luminous color mounted on the display substrate 301 can be transferred at intervals of 3p(m).

Unlike this case, even in the case where the column pitch of the micro-LEDs 100 on the growing substrate 101 is P(n) and the row pitch is P(m), the adsorption regions 1100 are arranged in a diagonal direction, and the column pitch and the row pitch of the adsorption regions are 3p(n) and 3p(m), respectively. Here, the micro-LEDs 100 which are transferred at this time, that is, the micro-LEDs corresponding to the columns or rows corresponding to the multiples of three, may be any one luminous color LEDs among red, green, blue, and white LEDs. With this configuration, the micro-LEDs 100 of the same luminous color, which are mounted on the display substrate 301, are spaced at intervals of 3p(n) and 3p(m), thereby transferring the micro-LEDs 100 having the same luminous color in the diagonal direction.

FIGS. 5A to 5D are process diagrams illustrating a transfer method using the micro-LED transfer head 1000 according to the first embodiment of the present invention.

Figure 5A:
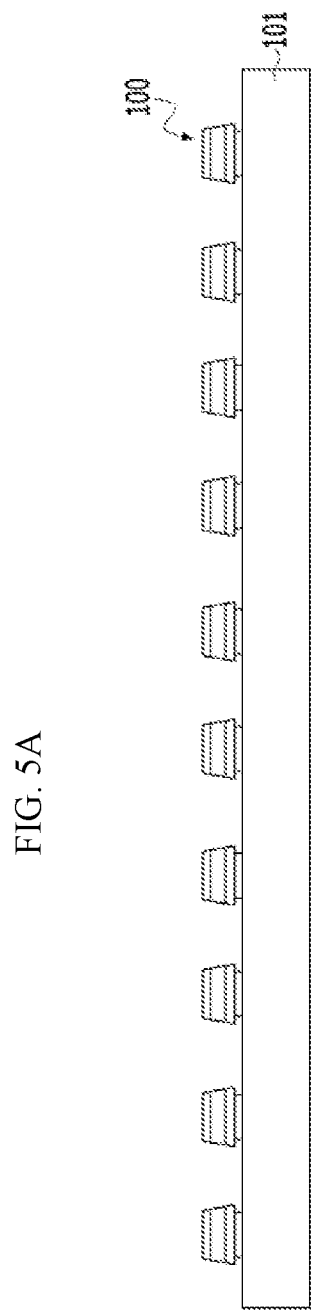

Referring to FIG. 5A, a growing substrate 101 is cut along dicing lanes by a laser beam or the like so that a plurality of micro-LEDs 100 formed on the growing substrate 101 can be separated individually from the growing substrate 101.

Figure 5B:
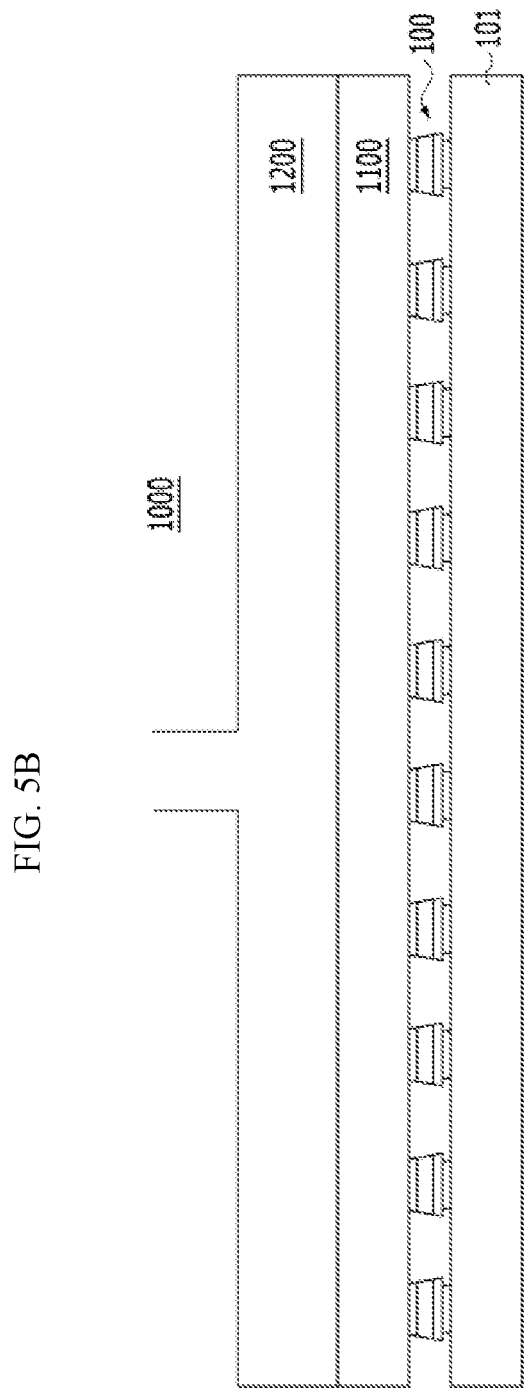

Referring to FIG. 5B, the transfer head 1000 is moved to above the growing substrate 101, and then the transfer head 1000 is lowered. A vacuum pressure is generated by vacuuming through a vacuum port. Thus, the vacuum pressure is transferred to a porous member 1100 so that micro-LEDs 100 are vacuum-adsorbed by the porous member 1100. When the transfer head 1000 adsorbs the micro-LEDs 100 by using a vacuum force, the porous member 1100 of the transfer head 100 can come into contact with and then vacuum-adsorb the micro-LEDs 100. When the porous member 1100 and the micro-LEDs 100 come into tight contact with each other, the micro-LEDs 100 are likely to be damaged. Therefore, preferably, the micro-LEDs 100 are picked up by a vacuum force and are maintained with a clearance between the lower surface of the porous member 1100 and the upper surfaces of the micro-LEDs 100.

Next, as illustrated in FIG. 5C, the transfer head 1000 is lifted and moved in a state in which the vacuum force for adsorbing the micro-LEDs 100 is maintained.

Figure 5D:
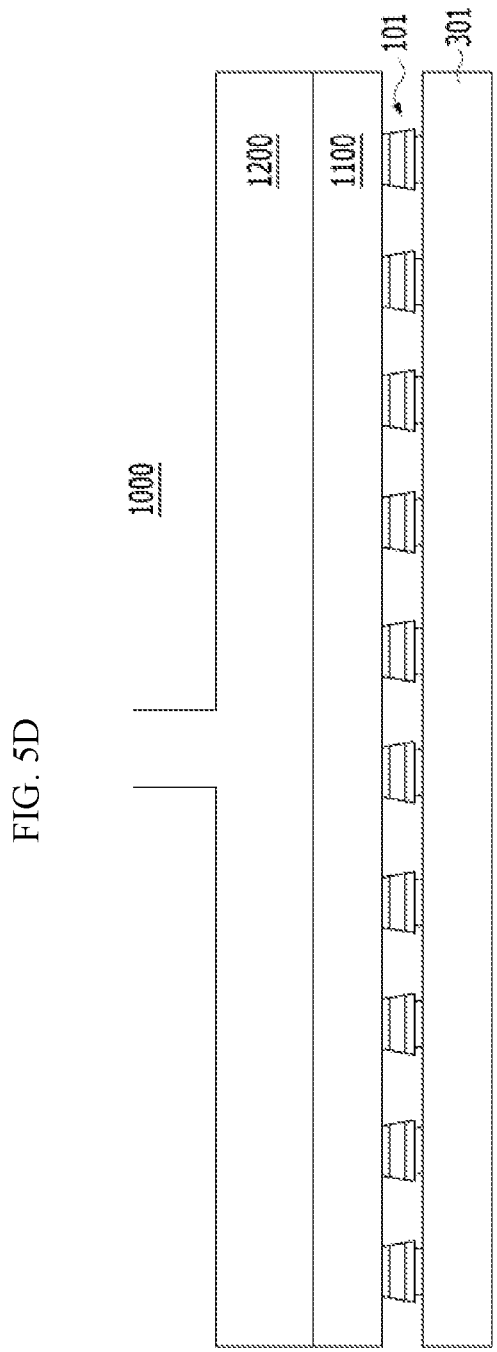

Referring to FIG. 5D, the transfer head 1000 is moved to above a display substrate 301 and is then lowered. At this time, the micro-LEDs 100 are transferred to the display substrate 301 by releasing the vacuum pressure created in the pores of the porous member 1100 via the vacuum port.

Second Embodiment

Hereinafter, a second embodiment of the present invention will be described. It should be noted that in describing the second embodiment below, characteristic elements in comparison with the first embodiment will be described, and description of the same or similar elements to those in the first embodiment will be omitted.

Figure 6:
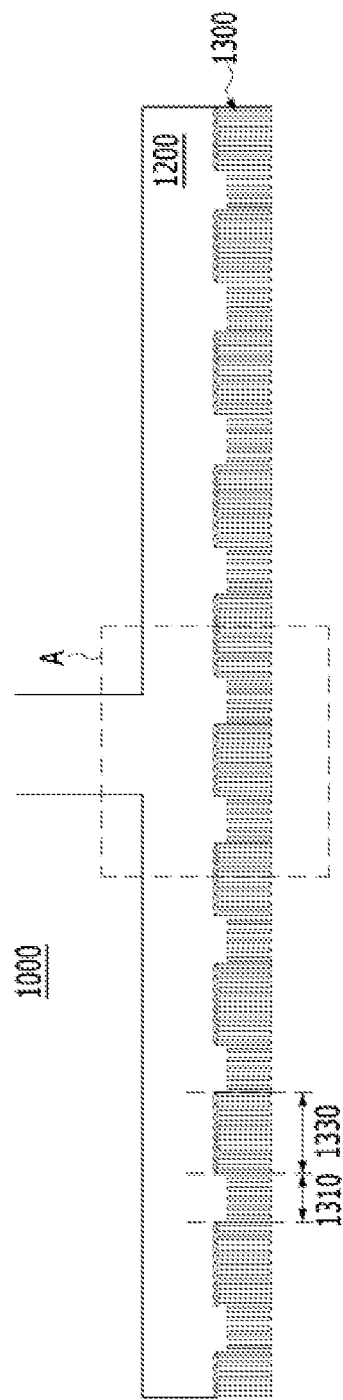
FIG. 6 is a diagram illustrating a micro-LED transfer head according to a second embodiment of the present invention.
Figure 7:
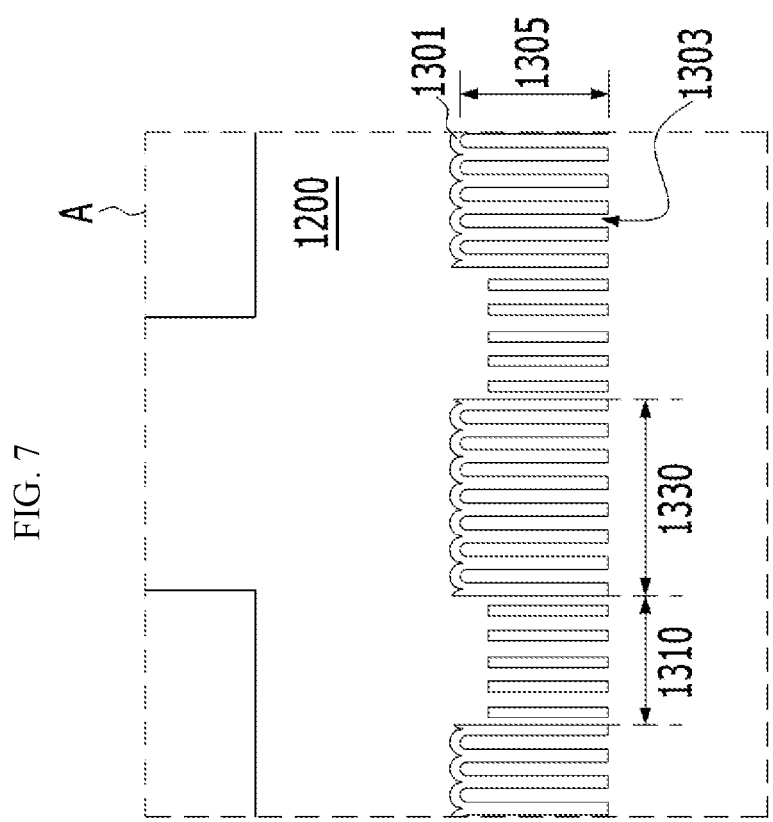
FIG. 7 is an enlarged view of a portion "A" of FIG. 6.
Figure 8:
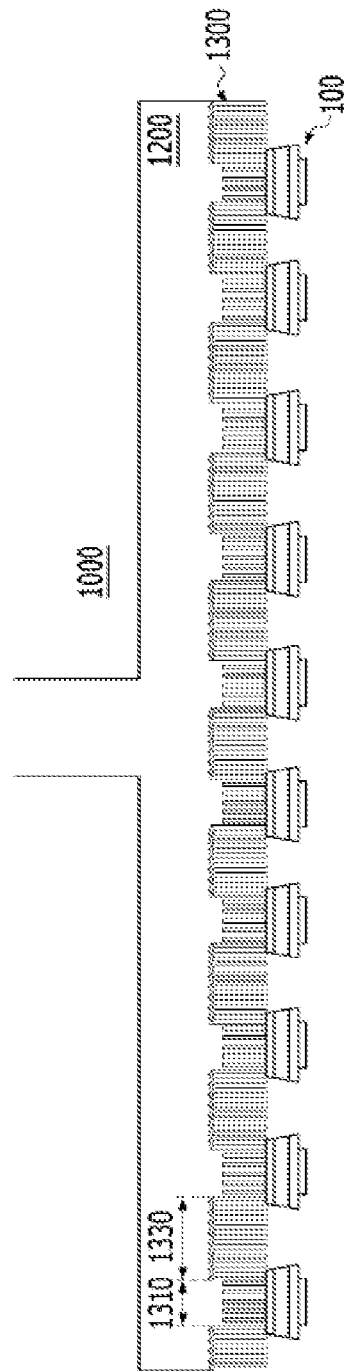
FIG. 8 is a diagram illustrating a state in which the micro-LED transfer head according to the second embodiment of the present invention adsorbs micro-LEDs.

FIG. 6 is a view illustrating a micro-LED transfer head 1000 according to the second preferred embodiment of the present invention. FIG. 7 is an enlarged view of a portion 'A' of FIG. 6. FIG. 8 is a view illustrating a state in which the micro-LED transfer head 1000 according to the second embodiment vacuum-adsorbs micro-LEDs.

The micro-LED transfer head 1000 according to the second embodiment is characterized in that a porous member 1100 is an anodic oxide film 1300 having pores formed by anodizing a metal.

The anodic oxide film 1300 refers to a film formed by anodizing a metal base material and the pores 1303 refer to holes formed when anodizing the metal base metal to form the anodic oxide film 1300. For example, when the metal base material is aluminum (Al) or an aluminum alloy, anodization of the base material forms the anodic oxide film 1300 made of anodized aluminum ($Al_2O_3$) on the surface of the base material. As described above, the formed anodic oxide film 1300 is divided into a barrier layer 1301 in which the pores 1303 are not formed, and a porous layer in which the pores 1303 are formed. The barrier layer 1301 is located on the upper surface of the base material and the porous layer is located on the upper surface of the barrier layer 1301. When the base material is removed after the anodic oxide film 1300 composed of the barrier layer 1301 and the porous layer are formed, only the anodic oxide film 1300 made of anodized aluminum ($Al_2O_3$) remains.

The anodic oxide film 1300 has the pores 1303 that are uniform in diameter, are vertically elongated, and regularly arranged. Accordingly, when the barrier layer 1301 is removed, the pores 1303 each have a structure vertically continuously extending and being open at the upper end and the lower end thereof. Therefore, it is easy to form a vacuum pressure in the vertical direction through the pores.

The inside of the anodic oxide film 1300 has vertically extending air flow paths formed by the vertical pores 1303. The internal width of the pores 1303 has a size of several to several hundreds nm. For example, when the size of each micro-LED to be vacuum-adsorbed is 30 µm×30 µm and the internal width of the pores 1303 is several nm, the micro-LEDs 100 can be vacuum-adsorbed using tens of millions of pores 1303. On the other hand, when the size of each micro-LED to be vacuum-absorbed is 30 µm×30 µm and the internal width of the pores 1303 is several hundreds nm, the micro-LEDs 100 can be vacuum-adsorbed by using tens of thousands of pores 1303. The micro-LEDs are basically composed of a first semiconductor layer 102, a second semiconductor layer 104, an active layer 103 formed between the first semiconductor layer 102 and the second semiconductor layer 104, a first contact electrode 106, and a second contact electrode 107, resulting in a lightweight structure. Therefore, the micro-LEDs 100 can be vacuum-adsorbed by vacuum force generated through several tens to several tens of millions of pores 1303 formed in the anodic oxide film 1300.

The upper side of the anodic oxide film 1300 is provided with a vacuum chamber 1200. The vacuum chamber 1200 is connected to a vacuum port for creating a vacuum pressure. The vacuum chamber 1200 functions to create or release a vacuum pressure in the vertical pores formed in the anodic oxide film 1300 according to the operation of the vacuum port.

At the time of vacuum-adsorbing the micro-LEDs 100, the vacuum state is first created in the vacuum chamber 1200 and is then spread to the pores in the anodic oxide film 1300, so that a vacuum attraction force for attracting the micro-LEDs 100 is created and thus the micro-LEDs 100 are vacuum-adsorbed. At the time of detaching the micro-LEDs 100 from the micro-LED transfer head, the vacuum pressure generated in the vacuum chamber 1200 is released. Therefore, the vacuum pressure is also released from the pores of the porous member 1100. As a result, the vacuum attraction force for attracting the micro-LEDs 100 is removed.

The anodic oxide film 1300 is divided into adsorption regions 1110 to which the micro-LEDs 100 are respectively adsorbed and non-adsorption regions 1130 to which the micro-LEDs 100 are not adsorbed. The adsorption region 1110 is a region to which the vacuum pressure in the vacuum chamber 1200 is propagated so that the micro-LEDs 100 can be adsorbed and the non-adsorption region 1130 is a region to which the vacuum pressure in the vacuum chamber 1200 is not propagated so that the micro-LEDs 100 cannot be adsorbed.

Preferably, the adsorption region 1310 is a region within which each pore 1303 is a vertical through hole having the upper end and the lower end which are both open, and the non-adsorption region 1330 is a region within which each pore 1330 is closed at either one of or both of the upper end or the lower end.

The non-adsorption region 1130 is implemented by locally forming a shielding member on the surface of the anodic oxide film 1100. The shielding member is formed to cover the entrances of the pores 1303 exposed from the surface of the anodic oxide film 1100. The shielding member may be formed on at least a part of the upper or lower surface of the anodic oxide film 1300. The shielding member is not limited in material, shape, and thickness as long as it can function to block the entrance of each pore, which is exposed from the surface of the porous member 1100. Preferably, the shielding member is an additional member provided on the anodic oxide film and is made of a photoresist (PR) (including a dry film PR), or a metal material. Alternatively, the shielding member refers to the barrier layer 1301.

The non-adsorption region 1330 is formed by closing any one of an upper end portion and a lower end portion of each vertical pore 1303 with the barrier layer 1301 which is formed during the formation of the anodic oxide film 1310. The adsorption region 1310 is formed by locally etching the barrier layer 1301 such that the upper end portion and the lower end portion of each vertical pore 1303 are open.

Since each pore 1303 having a vertically extending through hole form is formed by locally etching away the barrier layer 1301, the thickness of the anodic oxide film 1300 within the adsorption region 1310 is larger than the thickness of the anodic oxide film 1300 within the non-adsorption region 1330.

Although FIG. 6 illustrates the structure in which the barrier layer 1301 is provided as the top layer of the anodic oxide film 1300 and the porous layer 1305 having the pores 1303 is provided below the barrier layer 1301, the inverted structure is also possible. That is, within the non-adsorption region 1330, the barrier layer 1301 may be provided as the bottom layer of the anodic oxide film 1300.

On the other hand, although the configuration in which either the upper end or the lower end of each pore 1303 within the non-adsorption region 1330 is closed by the barrier layer 1301 has been described, a different configuration for the non-adsorption region is also possible. That is, the opposite surface that is not closed by the barrier layer 1301 may be covered by a coating layer so that both the upper end and the lower end of each pore 1301 may be closed. The configuration in which both the upper end and the lower end of each pore in the anodic oxide film 1300 are closed within the non-adsorption region 1330 is advantageous over the configuration in which either one of the upper end and the lower end of each pore is closed in terms that a likelihood that foreign matter remains in the pores 1303 is reduced.

Figure 9:
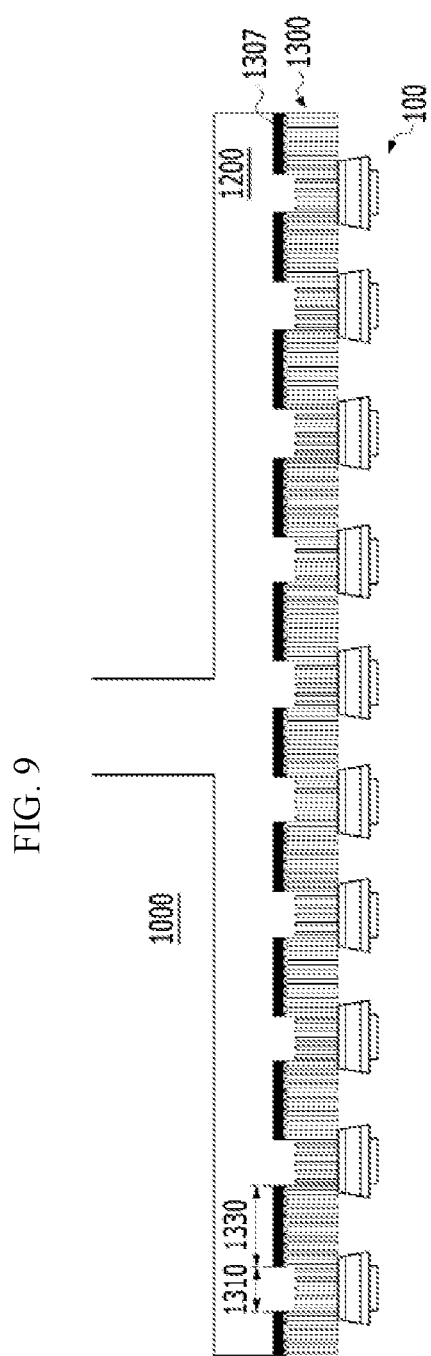
FIG. 9 is a diagram illustrating a modification to the second embodiment of the present invention.

FIG. 9 illustrates a modification to the transfer head illustrated in FIG. 8. The transfer head illustrated in FIG. 9 is further provided with a support member 1307 for reinforcing the strength of the anodic oxide film 1300. The support member 1307 is provided on the upper surface of the anodic oxide film 1300 within the non-absorption region 1330. The support 1307 may serve as a metal base material. The metal base material used for the anodic oxidation is not removed so as to remain on the barrier layer 1301. The remaining metal base material may function as the support member 1307. Referring to FIG. 9, each of the non-adsorption regions 1330 is provided with all of the metal base material 1307, the barrier layer 1301, and the porous layer 1305 having the pores 1303, and each of the adsorption regions 1310 is not provided with the metal base material 1307 and the barrier layer 1301 but is provided only with the porous layer 1305 having the pores 1303 which are through holes being open at the upper end and the lower end thereof. Since the metal base material 1307 is provided within the non-adsorption regions 1330, the anodic oxide film 1300 is reinforced. Since the strength of the relatively weak anodic oxide film 1300 increases due to the presence of the support member 1307 as described above, the transfer head 1000 formed of the anodic oxide film 1300 can be provided in a relatively large size.

Figure 10A:
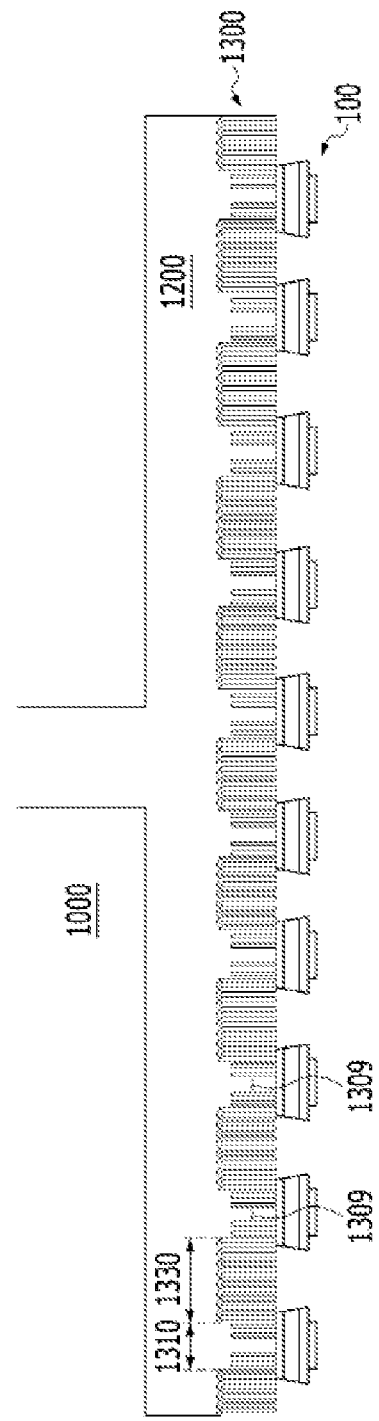
FIGS. 10A through 10C are diagrams illustrating a modification to the second embodiment of the present invention.

FIG. 10A illustrates a modification to the transfer head illustrated in FIG. 8. Referring to FIG. 10A, the transfer head is provided with transmission holes 1309 in addition to the pores 1303 which naturally occur in the anodic oxide film 1300 within the adsorption regions 1310. The transmission holes 1309 are formed to pass through the anodic oxide film 1300 from the upper surface to the lower surface. The transmission holes 1309 have a larger diameter than the pores 1303. The configuration in which the transmission holes 1309 having a larger diameter than the pores 1303 are present in addition to the pores 1303 has an advantage of increasing a vacuum adsorption area for adsorbing the micro-LEDs 100 compared to the configuration in which only the pores 1303 are provided to adsorb the micro-LEDs 100.

The transmission holes 1309 are formed by etching the anodic oxide film 1300 in the vertical direction after the anodic oxide film 1300 and the pores 1303 are formed. Since the transmission holes 1309 are formed through etching, it is possible to more stably form the transmission holes 1309 than a manner of forming the transmission holes 1309 by widening the pores 1303. In other words, when the transmission holes 1309 are formed by widening the pores 1303, the side walls of the pores 1303 are likely to collapse. That is, the pores 1309 may be deformed. However, by forming the transmission holes 1309 by using an etching process, the transmission holes 1309 can be easily formed without causing damage to the side walls of the pores 1303. Furthermore, it is possible to prevent the transmission holes 1309 from being damaged. It is preferable that the transmission holes 1309 are dispersed in the center of each absorption region 1310 in terms of prevention of vacuum leakage in the absorption region 1310.

On the other hand, when viewing the transfer head 1000 as a whole, the transmission holes 1309 vary in size and number with positions of the absorption regions 1310. When the vacuum port is positioned at the center of the transfer head 1000, the vacuum pressure decreases toward the periphery of the transfer head 1000, which may result in uneven vacuum pressure among the adsorption regions 1310. In this case, the sizes of the transmission holes 1309 formed within the adsorption regions 1301 positioned on the periphery side of the transfer head 1000 are set to be larger than the sizes of the transmission holes 1309 formed within the adsorption regions 1310 positioned on the center side of the transfer head 1000. By varying the size of the transmission holes 1309 formed within the adsorption regions 1310 according to the positions of the adsorption regions 1310, unevenness of the vacuum pressure among the adsorption regions 1310 can be resolved and a uniform vacuum adsorption force can be generated.

Figure 10B:
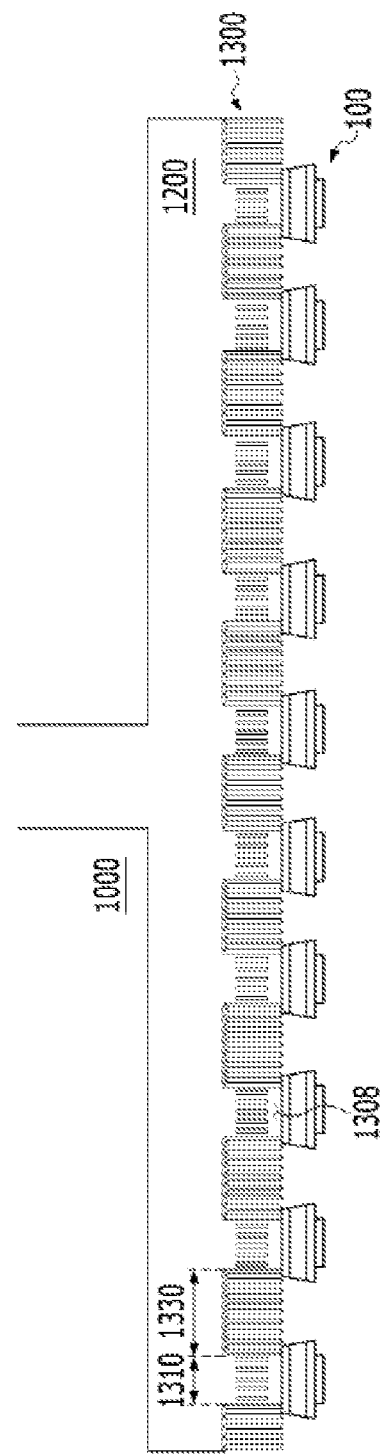

FIG. 10B illustrates a modification to the transfer head illustrated in FIG. 8. In the transfer head illustrated in FIG. 10B, adsorption cavities 1308 are formed in the lower surface of the anodic oxide film 1300 within the respective adsorption regions 1310. The absorption cavities 1308 have a larger horizontal area than the pores 1303 or the transmission holes 1309 and have a horizontal area smaller than that of the upper surface of the micro-LEDs 100. The adsorption cavities 1308 function to further increase the vacuum absorption area for the micro-LEDs 100 and to provide uniform vacuum absorption regions for the micro-LEDs 100 through the absorption cavities 1308. The adsorption cavities 1308 are formed by partially etching the anodic oxide film 1300 in a depth direction after the anodic oxide film 1300 and the pores 1303 are formed.

Figure 10C:
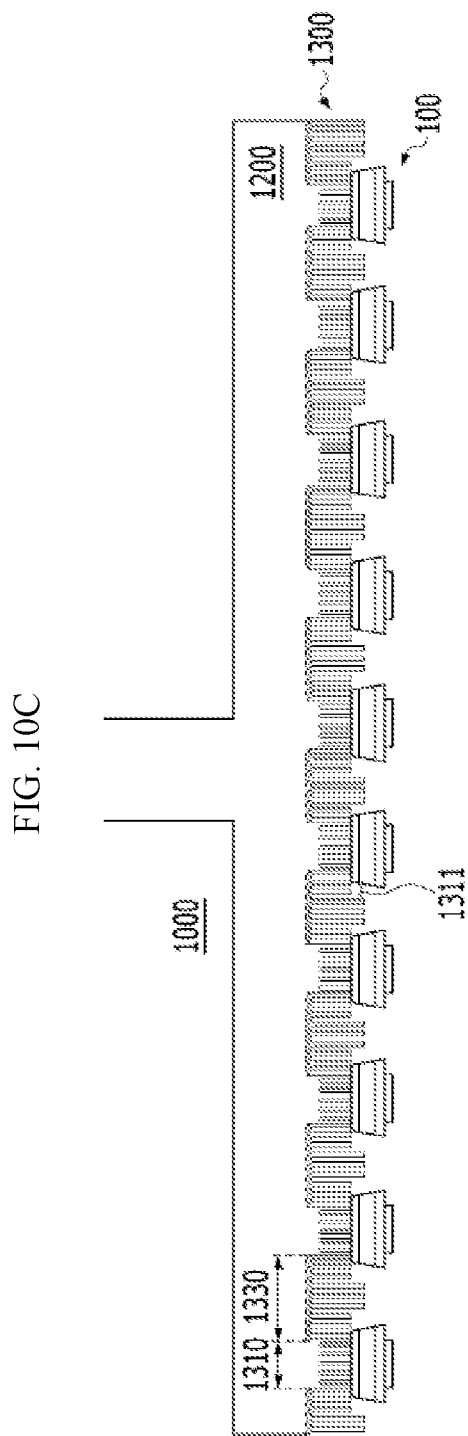

FIG. 10C illustrates a modification to the transfer head illustrated in FIG. 8. In the transfer head illustrated in FIG. 10C, seating cavities 1311 are additionally formed in the lower surface of the anodic oxide film 1300 within the respective adsorption regions 1310. The seating cavity 1310 has a horizontal area that is larger than the horizontal area of the upper surface of the micro-LEDs 100. Since the micro-LEDs 100 are received in the seating cavities 1310, the displacements of the micro-LEDs 100 can be restricted when the transfer head 1000 is moved. The adsorption cavities 1310 are formed by partially etching the anodic oxide film 1300 in a depth direction after the anodic oxide film 1300 and the pores 1303 are formed.

Figure 12:
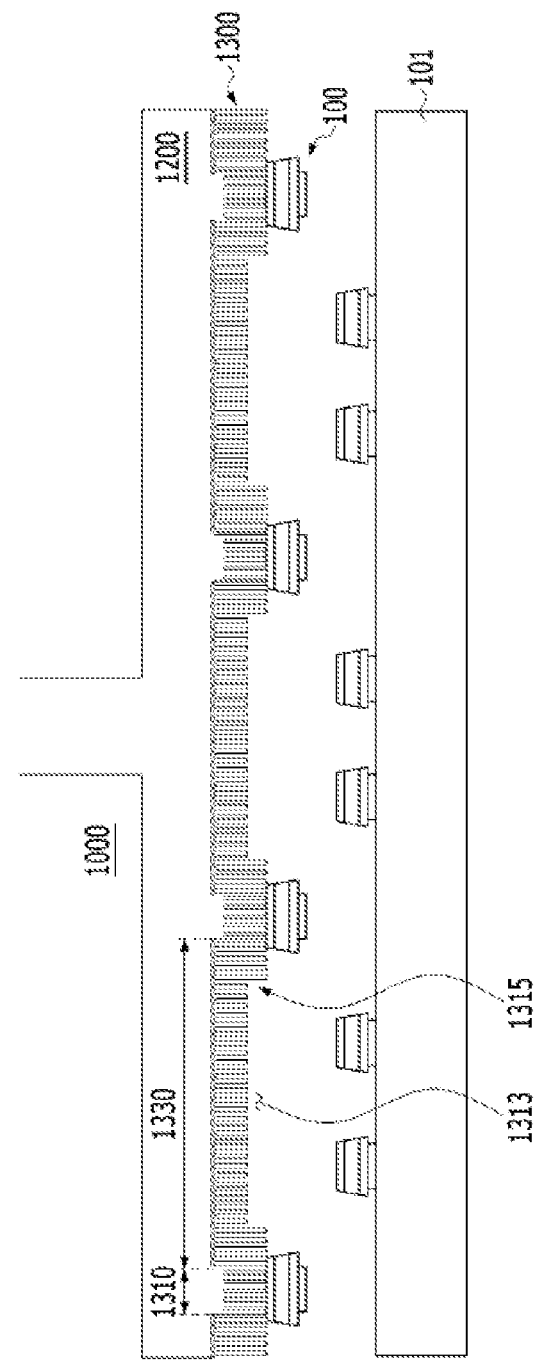

FIGS. 11 and 12 illustrate a modification to the transfer head illustrated in FIG. 8. In the transfer head illustrated in FIGS. 11 and 12, escaping cavities 1311 are additionally formed in the lower surface of the anodic oxide film 1300 within the respective non-adsorption regions 1310. The escaping cavities 1313 function to prevent interference with non-target micro-LEDs 100 when the transfer head 1000 descends to vacuum-adsorb the micro-LEDs 100 disposed at specific positions, columns, or rows. Due to the presence of the escaping cavities 1313 within the non-adsorption regions, protrusions 1315 are provided on the lower surface of the transfer head. The protrusions 1315 protrudes further downward in the vertical direction than the escaping cavities 1313, and the micro-LEDs 100 are absorbed to the lower ends of the respective protrusions 1315. The horizontal area of each protrusion 1315 is equal to or larger than the horizontal area of each adsorption region 1310. The horizontal area of each protrusion 1315 is larger than the horizontal area of the upper surface of each micro-LED 100 and the horizontal area of each adsorption region 1310 is smaller than the width of the upper surface of the each micro-LED 100. This configuration has an advantage of preventing leakage of a vacuum pressure.

The horizontal area of the escaping cavity 1313 is larger than the horizontal area of at least one micro-LED 100. Referring to FIG. 11, one escaping cavity 1313 has a horizontal size equal to the sum of the horizontal sizes of two micro-LEDs 100 and twice the horizontal spacing between the two micro-LEDs 100. With this dimension setting, when the transfer head 1000 is lowered to vacuum-adsorb target micro-LEDs 100 which are targets to be adsorbed, interference with the non-target micro-LEDs 100 which are not targets to be adsorbed can be prevented.

Referring to FIGS. 11 and 12, the target micro-LEDs 100 to be adsorbed from the growing substrate 101 are the micro-LEDs 100 located at the first, fourth, seventh, and tenth positions with respect to the left side of the drawings. When the transfer head 1000 having the escaping cavities 1313 is used, only the target micro-LEDs 100 corresponding to the first, fourth, seventh, and tenth positions can be vacuum-adsorbed and transferred without interference with the non-target micro-LEDs 100.

Third Embodiment

Hereinafter, a third embodiment of the present invention will be described. It should be noted that in describing the third embodiment below, characteristic elements in comparison with the first embodiment will be described, and description of the same or similar elements to those in the first embodiment will be omitted.

Figure 13:
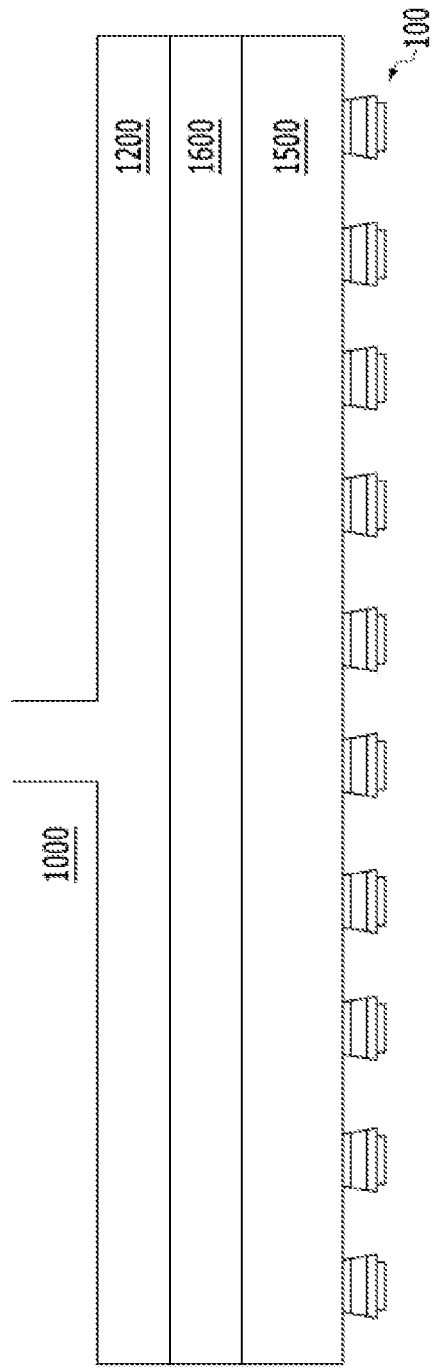
FIG. 13 is a diagram illustrating a micro-LED transfer head according to a third embodiment of the present invention.
Figure 14:
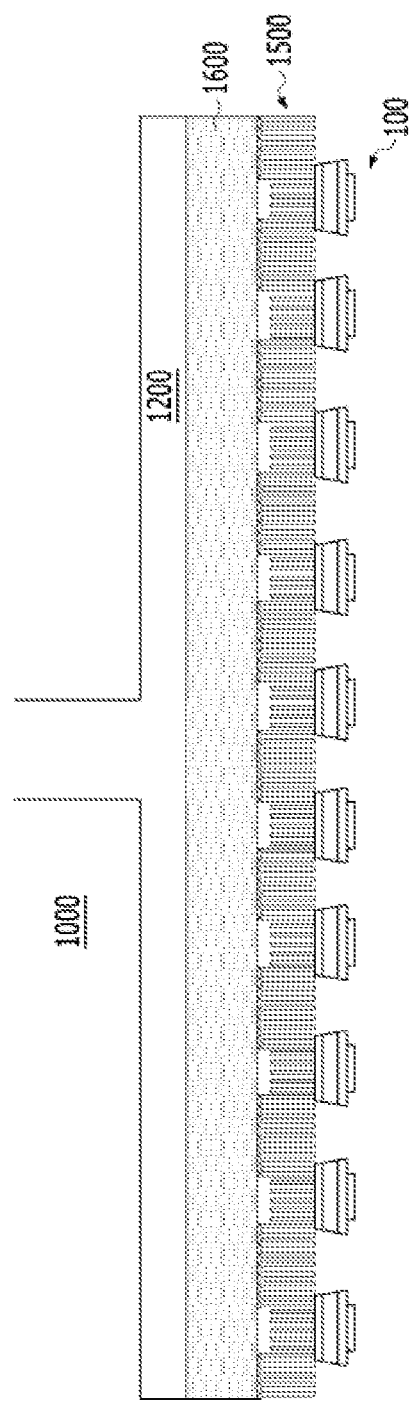
FIG. 14 is a diagram illustrating a modification to the third embodiment of the present invention.

FIG. 13 is a diagram illustrating a micro-LED transfer head 1000 according to the third embodiment of the present invention, and FIG. 14 is a diagram illustrating the details of a first porous member and a second porous member of FIG. 13.

The micro-LED transfer head 1000 according to the third embodiment is characterized in that a double layer porous member including a first porous member 1500 and a second porous member 1600 is used instead of the porous member 1100 of the first embodiment.

The second porous member 1600 is provided on top of the first porous member 1500. The first porous member 1500 is configured to vacuum-adsorb micro-LEDs 100 and the second porous member 1600 is disposed between a vacuum chamber 1200 and the first porous member 1500 to transfer the vacuum pressure of the chamber 1200 to the first porous member 1500.

The first and second porous members 1500 and 1600 have different porosity characteristics. For example, the first and second porous members 1500 and 1600 differ in some characteristics such as the arrangement and size of the pores and the material and shape of the porous members.

In terms of the arrangement of the pores, the pores are regularly arranged in one of the first and second porous members 1500 and 1600 but the pores are irregularly arranged in the other porous member of the first and second porous members 1500 and 1600. In terms of the sizes of the pores, any one of the first and second porous members 1500 and 1600 has a larger pore size than the other. Here, the size of the pores refers to the average size of the pores or the maximum pore size. In terms of the materials of the porous members, when one of the porous members is made of one of organic, inorganic (ceramic), metal, and hybrid porous materials, the other is made of a material which is selected among the organic, inorganic (ceramic), metal, and hybrid porous materials and is different from that of the former porous member. In terms of the shapes of the porous members, the shapes of the first and second porous members 1500 and 1600 are different from each other.

As described above, the functions of the transfer head 1000 may vary with the arrangement or size of pores in the first and second porous members 1500 and 1600 and with the shape and material of the first and second porous members 1500 and 1600. The first and second porous members 1500 and 1600 are in complementary relations. The number of the porous members is not limited to two as with the case of the first and second porous members. The use of more than two porous members may fall within the scope of the third embodiment as long as the porous members are in complementary relations.

Referring to FIG. 14, the first porous member 1500 is an anodic oxide film 1300 having pores formed by anodizing a metal base metal. The first porous member 1500 may have the configuration presented in one of the second embodiment and the modifications described above. The second porous member 1600 may be a porous support member having a function of supporting the first porous member 1500. The material of the second porous member 1600 is not limited as long as it can achieve the function of supporting the first porous member 1500, and the structure of the porous member 1100 of the first embodiment described above may be included. The second porous member 1600 may be made of a rigid porous material having an effect of preventing central sagging of the first porous member 1500. For example, the second porous member 1600 is a porous ceramic material.

Meanwhile, the first porous member 1500 has the configuration presented in any one of the second embodiment and its modifications described above, and the second porous member 1600 is a porous buffering member that buffers a contact impact when the first porous member 1500 comes into contact with the micro-LEDs 100. The material of the second porous member 1600 is not limited as long as it can achieve the function of buffering the first porous member 1500. The configuration of the porous member 1100 of the first embodiment described above may be adopted. The second porous member 1600 may be a soft porous buffer that prevents micro-LEDs from being damaged at the time of coming into contact with the first porous member 1500 when the first porous member 1500 comes into contact with the micro-LEDs 100 to vacuum-adsorb the micro- LEDs 100. For example, the second porous member 1600 may be a porous elastic material such as a sponge or the like.

Fourth Embodiment

Hereinafter, a fourth embodiment of the present invention will be described. It should be noted that in describing the fourth embodiment below, characteristic elements in comparison with the first embodiment will be described, and description of the same or similar elements to those in the first embodiment will be omitted.

Figure 15:
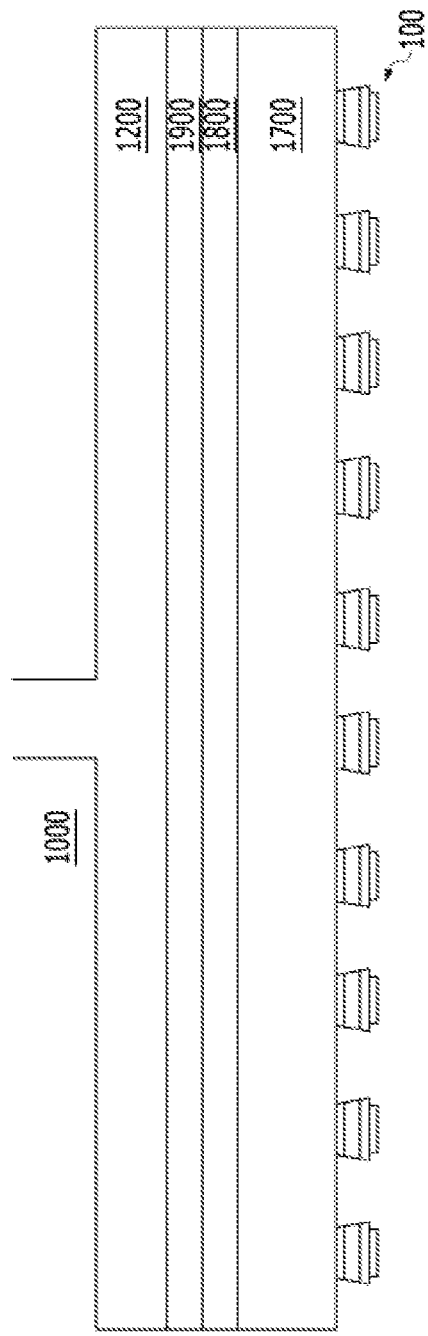
FIG. 15 is a diagram illustrating a micro-LED transfer head according to a fourth embodiment of the present invention.

FIG. 15 is a diagram illustrating a micro-LED transfer head 1000 according to the fourth embodiment of the present invention.

The micro-LED transfer head 1000 according to the fourth embodiment is characterized in that a triple layer porous member including a first porous member 1700, a second porous member 1800, and a third porous member 1900 is used instead of the porous member 1100 of the first embodiment.

The second porous member 1800 is provided on the first porous member 1700 and the third porous member 1900 is provided on the second porous member 1800. The first porous member 1700 functions to vacuum-adsorb micro-LEDs 100. At least one of the second porous member 1800 and the third porous member 1900 is a rigid porous support and the other of the second porous member 1800 and the third porous member 1900 is a soft porous buffer.

With the configuration described above, the micro-LEDs 100 can be vacuum-adsorbed, the center sagging phenomenon of the first porous member 1700 can be prevented, and damage to the micro-LEDs 100 can be prevented.

Fifth Embodiment

Hereinafter, a fifth embodiment of the present invention will be described. It should be noted that in describing the fifth embodiment below, characteristic elements in comparison with the first embodiment will be described, and description of the same or similar elements to those in the first embodiment will be omitted.

Figure 16:
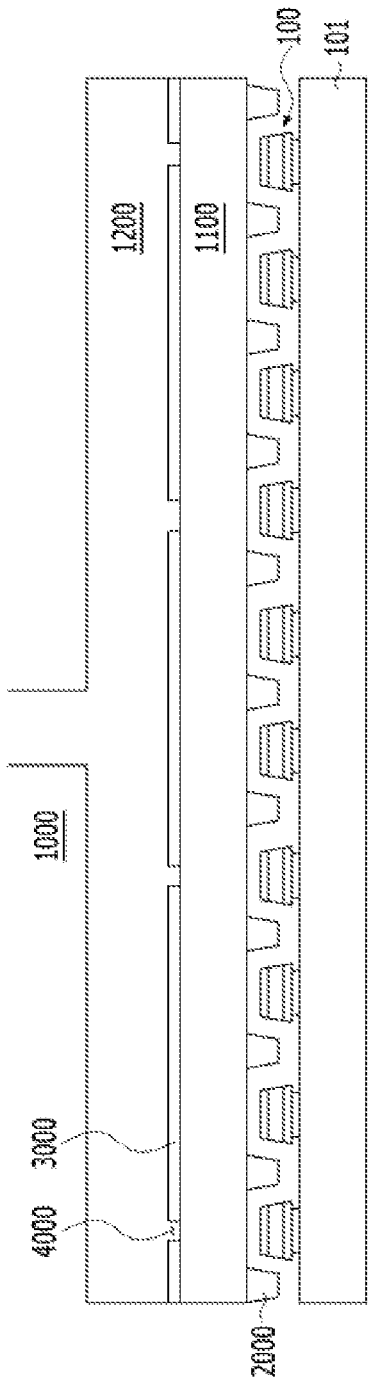
FIG. 16 is a diagram illustrating a micro-LED transfer head according to a fifth embodiment of the present invention.

FIGS. 16 and 17 are diagrams illustrating a micro-LED transfer head 1000 according to the fifth embodiment of the present invention.

The micro-LED transfer head 1000 according to the fifth embodiment is characterized in that a protruding dam 2000 is provided at a lower end of a porous member 1100.

The protruding dam 2000 is formed of a photoresist (PR) including a dry film PR, or a metal material. However, the material of the protruding dam 2000 is not specifically limited as long as a structure having a predetermined height can be formed on the surface of the porous member 1100.

The cross-sectional shape of the protruding dam 2000 is not particularly limited. It may be a square, a circle, or a triangle. The cross-sectional shape of the protruding dam 2000 is determined in consideration of the shape of the micro-LEDs 100. For example, when the micro-LEDs 100 have a tapered structure such that the size of a lower end is larger than the size of an upper end, the protruding dam 2000 has a reverse tapered structure to reduce the interference between the micro-LEDs 100 and the protruding dam 2000. Referring to FIG. 16, the protruding dam 2000 has a cross-sectional shape that is tapered to the lower end thereof.

When the transfer head 1000 is lowered to a suction position to vacuum-adsorb the micro-LEDs 100 disposed on the growing substrate 101, a driving operation error of a drive unit for driving the transfer head 1000 may cause accidental contact between the porous member 1100 and the micro-LEDs 100, which may result in damage to the micro-LEDs 100.

For this reason, it is preferable that the lower surface of the porous member 1100 and the upper surfaces of the micro-LEDs 100 are spaced from each other at the suction position at which the transfer head 1000 vacuum-adsorb the micro-LEDs 100. However, when there is a clearance between the lower surface of the porous member 1100 and the micro-LEDs 100, a larger vacuum pressure is required for vacuum adsorption as compared with the case where the micro-LEDs 100 are adsorbed in a state of being in contact with the porous member 1100.

However, according to the fifth embodiment, since the protruding dam 2000 of the transfer head 1000 reduces the amount of air flowing into the adsorption regions 1110 from the surrounding regions, the porous member 1100 can vacuum-adsorb the micro-LEDs 100 using a relatively weak vacuum pressure as compared with the case where the protruding dam is not provided in the micro-LED transfer head.

When the height of the protruding dam 2000 is greater than the height of the micro-LEDs 100, although the protruding dam 2000 comes into contact with the growing substrate 101 when the transfer head 1000 is disposed at the bottom dead center, the lower surface of the porous member 1100 is not in contact with the upper surface of the micro-LEDs 100. Since the protruding dam 2000 functions to space the lower surface of the porous member 1100 and the upper surface of the micro-LEDs 100 from each other while it is in contact with the growing substrate 101, the protruding dam 2000 can reliably block the inflow of air from the surrounding regions to the adsorption regions 1110 as compared with the structure in which the protruding dam 2000 is spaced from the growing substrate 101. Therefore, the porous member 1100 can more easily vacuum-adsorb the micro-LEDs 10.

Also, even though the micro-LEDs 100 are finely displaced sideways by the air flow, the displacement of the micro-LEDs 100 can be physically restricted due to the protruding dam 2000.

A shielding member 3000 for forming non-adsorption regions is locally formed on the upper surface of the porous member 1100. On the other hand, regions 4000 (i.e., adsorption regions 1310) formed to communicate with the vacuum chamber 1200 are provided between the portions provided with the shielding member 4000.

The shielding member is not limited in its material, shape and thickness as long as it can function to block pores formed in the porous member 1100. Preferably, the shielding member is an additional film formed of a photoresist (PR) (including a dry film PR) or a metal. When the porous member 1100 is formed of an anodic oxide film, the shielding member may be a barrier layer or a metal base material that is a base material for anodic oxidation.

Figure 17A:
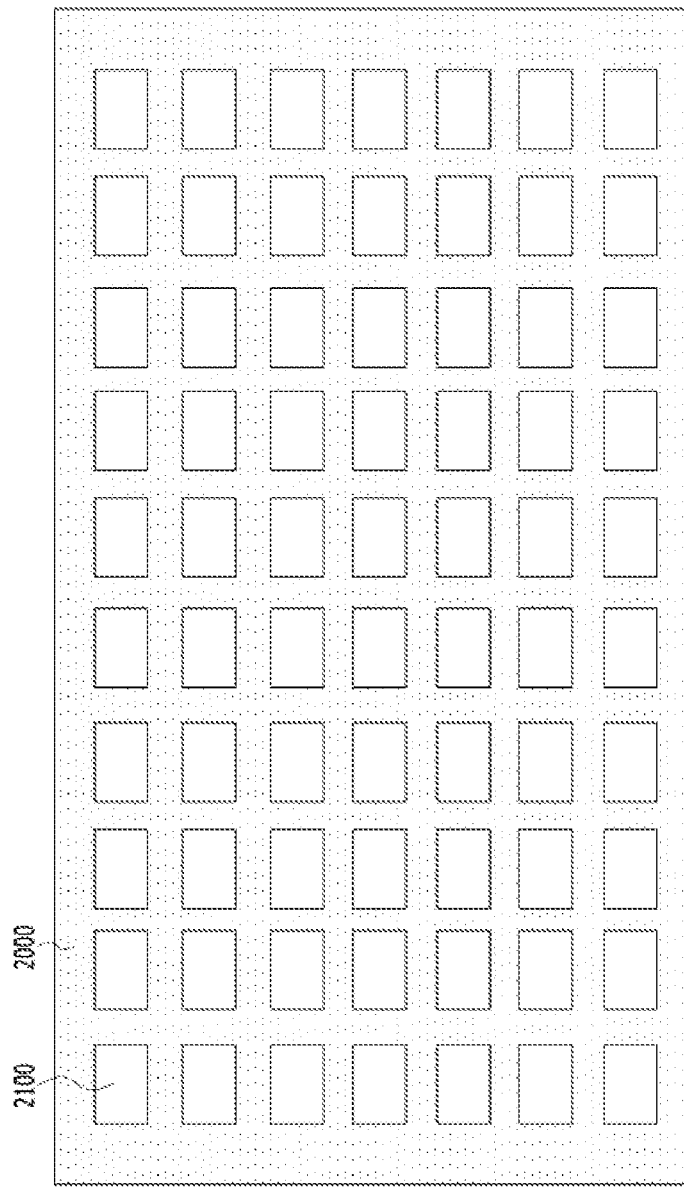
FIGS. 17A through 17C are diagrams illustrating a protruding dam of the micro-LED transfer head according to the fifth embodiment of the present invention.
Figure 17B:
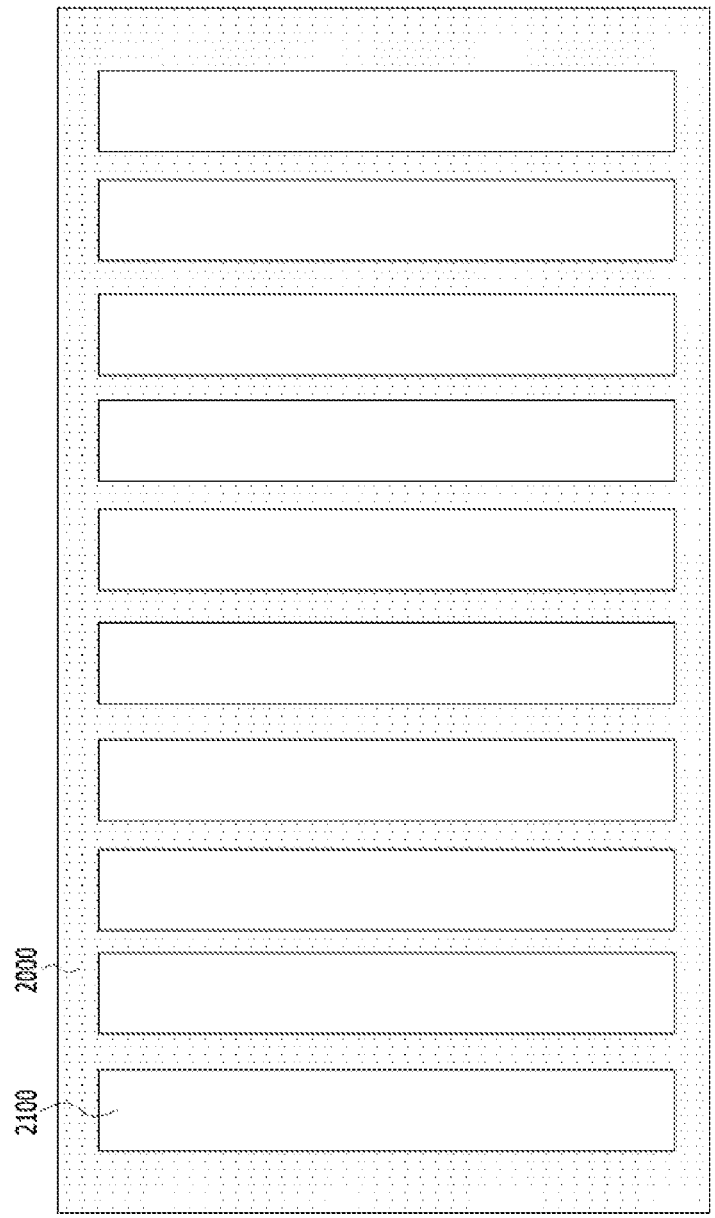
Figure 17C:
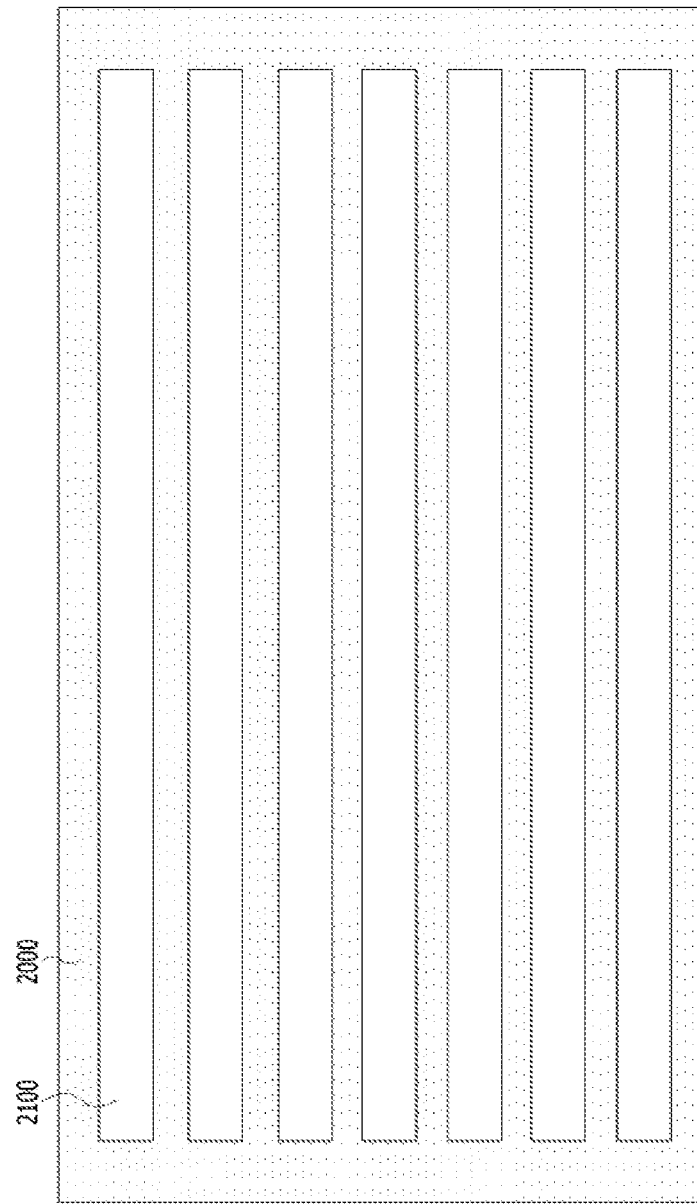

FIGS. 17A to 17C are views showing the bottom surface of the porous member 1100 provided with the protruding dam 2000. FIGS. 17A to 17C differ in the shape of the protruding dam 2000.

Referring to FIG. 17A, the protruding dam 2000 is formed over the overall surface of the transfer head except for openings 2100 which serve as the adsorption regions 1110. The openings 2100 in the protruding dam 2000 are formed at the same pitch as the micro-LEDs 100 disposed on the growing substrate 101. The openings 2100 may be arranged in a matrix of m×n as illustrated in FIG. 17A. In other words, when the pitch of the micro-LEDs 100 on the growing substrate 101 in the column direction is P(n) and the pitch in the row direction is P(m), the pitch of the openings 2100 in the column direction is P(n) and the pitch in the row direction is P(m). In this case, the openings 2100 of the protruding dam 2000 is in a 1:1 correspondence with the micro-LEDs 100 to be adsorbed.

Alternatively, referring to FIG. 17B, the openings 2100 of the protruding dam 2000 may be arranged in a matrix of 1×n. In this case, the number of openings 2100 formed in the protruding dam 2000 is n, and m micro-LEDs 100 are placed in each opening 2100 when the micro-LEDs 100 are adsorbed.

Referring to FIG. 17C, the openings 2100 of the protruding dam 2000 may be arranged in a matrix of m×1. In this case, the number of the openings 2100 formed in the protruding dam 2000 is m, and n micro-LEDs 100 are placed in each opening 2100 when the micro-LEDs 100 are adsorbed.

Figure 18:
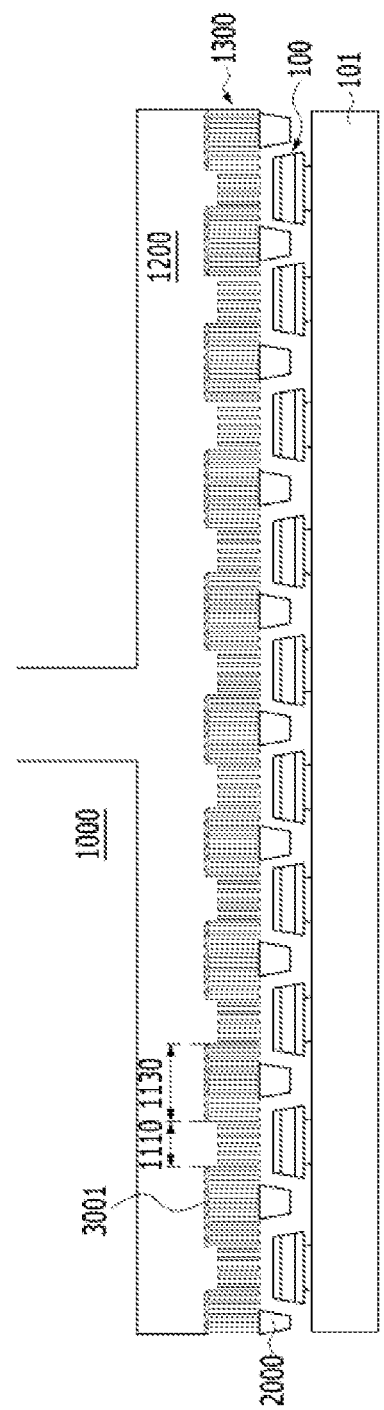
FIG. 18 is a diagram illustrating a modification to the fifth embodiment of the present invention.

The embodiment illustrated in FIG. 18 is characterized in that the porous member 1100 according to the fifth embodiment is formed of an anodic oxide film 1300 having pores formed by anodizing a metal. Referring to FIG. 18, the protruding dam 2000 is formed on the lower surface of the anodic oxide film 1300. The anodic oxide film 1300 is divided into adsorption regions 1110 within which the barrier layer 3001 on top of the anodic oxide film is removed and non-adsorption regions 1130 within which the top barrier layer 3001 is not removed but remains. The barrier layer functions as the shielding member 3000 shown in FIG. 16, and the region where the barrier layer 3001 is not formed functions as a region 4000 communicating with the vacuum chamber 1200 shown in FIG. 16.

Figure 19A:
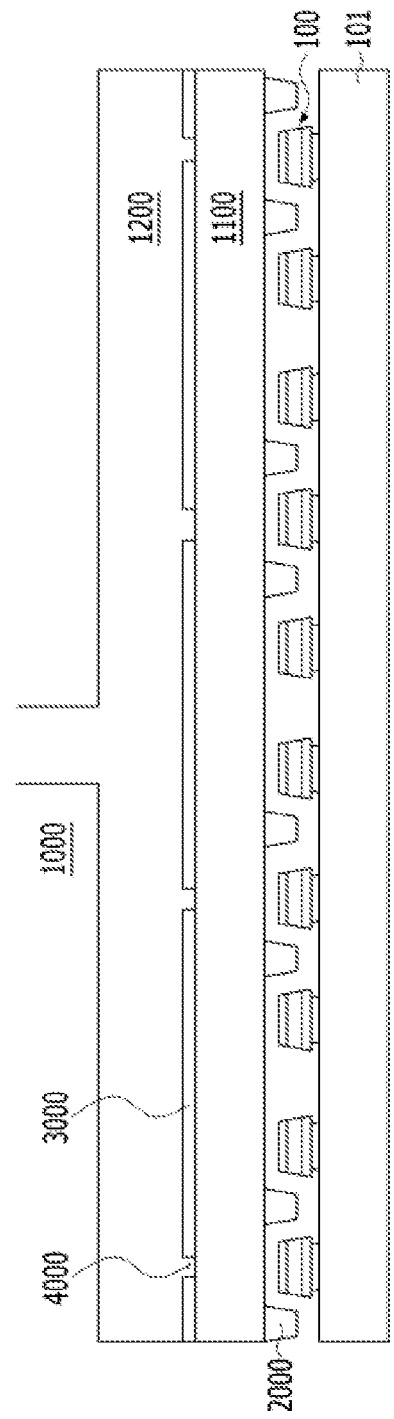

FIGS. 19A and 19B illustrate a modification to the transfer head according to the fifth embodiment of the present invention. The protruding dam 2000 is formed only around each of the micro-LEDs 100 to be adsorbed among the micro-LEDs 100 disposed within the respective adsorption regions 1110. The micro-LEDs 100 to be adsorbed in FIGS. 19A and 19B are micro-LEDs 100 located at first, fourth, seventh, and tenth positions with reference to the left side of the drawing. When the micro-LEDs 100 located at the first, fourth, seventh and tenth positions are vacuum-adsorbed by the transfer head 1000, the protruding dam 2000 functions to block the inflow of air into the respective adsorption regions 1110 from the surrounding regions. Here, the shape of the protruding dam 2000 formed on the lower surface of the anodic oxide film 1300 may be any one shown in FIGS. 17A to 17C.

Although the present invention has been described with reference to preferred embodiments, the preferred embodiments are presented to describe the technical spirit of the present invention only for illustrative purposes and those skilled in the art will appreciate that various modifications and changes are possible, without departing from the scope and spirit of the present invention. Therefore, it should be understood that the protection scope of the present invention is defined by the accompanying claims rather than the description which is presented above. Moreover, the present invention is intended to cover not only the exemplary embodiments but also various alternatives, modifications, equivalents and other embodiments that may be included within the spirit and scope of the embodiments as defined by the appended claims.

What is claimed is:

1. A transfer head for micro-LEDs, the transfer head comprising:
    a porous member being an anodic oxide film and having a plurality of vertical pores formed by anodizing a metal, wherein the plurality of vertical pores are continuously elongated in a vertical direction from an upper surface to a lower surface of the anodic oxide film; and
    a vacuum chamber disposed on the porous member,
    wherein the porous member comprises:
        an adsorption region in which a first plurality of vertical pores among the plurality of vertical pores are open at both an upper end and a lower end of the anodic oxide film such that a micro-LED is transferred by creating or releasing a vacuum pressure through the first plurality of vertical pores, and
        a non-adsorption region in which a second plurality of vertical pores among the plurality of vertical pores are closed by the anodic oxide film at the upper end, or the lower end, or both ends of the anodic oxide film such that the micro-LED is not transferred.

2. The transfer head according to claim 1, wherein a horizontal area of the absorption region is smaller than a horizontal area of an upper surface of the micro-LED.

3. The transfer head according to claim 1, wherein the non-adsorption region is formed such that the second plurality of vertical pores are closed at the upper end or the lower end of the anodic oxide film by a barrier layer formed during formation of the anodic oxide film, and the adsorption region is formed such that the barrier layer is removed so that the first plurality of vertical pores are open at both the upper and lower ends.

4. The transfer head according to claim 1, wherein the porous member has a protruding dam at the lower surface thereof.

5. The transfer head according to claim 1, further comprising a porous support provided between the vacuum chamber and the porous member to support the porous member.

6. The transfer head according to claim 1, further comprising a porous buffering member provided between the vacuum chamber and the porous member for buffering a shock applied to the porous member.

7. The transfer head according to claim 1, wherein the porous member comprises a first porous member and a second porous member, the first porous member vacuum-adsorbs the micro-LED, and the second porous member is disposed between the vacuum chamber and the first porous member to transfer the vacuum pressure of the vacuum chamber to the first porous member.

8. The transfer head according to claim 1,
    wherein the adsorption region further comprises:
    a transmission hole that is formed by etching one or more vertical pores among the first plurality of vertical pores, the transmission hole having a larger diameter than that of each of the first plurality of vertical pores, and
    wherein the transmission hole is open at both the upper end and the lower end of the anodic oxide film.

* * * * *